United States Patent
Bilbao De Mendizabal et al.

(10) Patent No.: US 11,035,887 B2
(45) Date of Patent: Jun. 15, 2021

(54) CURRENT SENSOR WITH INTEGRATED CURRENT CONDUCTOR

(71) Applicant: Melexis Technologies SA, Bevaix (CH)

(72) Inventors: Javier Bilbao De Mendizabal, Zurich (CH); Simon Houis, Neuchatel (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 16/711,931

(22) Filed: Dec. 12, 2019

(65) Prior Publication Data
US 2020/0191835 A1 Jun. 18, 2020

(30) Foreign Application Priority Data

Dec. 12, 2018 (EP) ..................................... 18212127
Mar. 27, 2019 (EP) ..................................... 19165398

(51) Int. Cl.
*G01R 15/20* (2006.01)
*G01R 19/00* (2006.01)
*G01R 19/32* (2006.01)

(52) U.S. Cl.
CPC ......... *G01R 15/202* (2013.01); *G01R 15/207* (2013.01); *G01R 19/0092* (2013.01); *G01R 19/32* (2013.01)

(58) Field of Classification Search
CPC G01R 15/202; G01R 15/207; G01R 19/0092; G01R 19/32; G01R 15/205; G01R 33/0011; G01R 33/072; G01R 33/091; G01R 33/0094; G01R 33/0005; G01R 15/20; G01R 19/25

USPC .................................... 324/105, 76.11, 71.1
See application file for complete search history.

(56) References Cited

U.S. PATENT DOCUMENTS

| | | | |
|---|---|---|---|
| 9,121,885 B2* | 9/2015 | Elian | G01R 33/072 |
| 9,810,721 B2* | 11/2017 | Racz | G01R 15/202 |
| 10,290,554 B2* | 5/2019 | Racz | H01L 21/4825 |
| 2017/0160313 A1 | 6/2017 | Koiwa et al. | |
| 2017/0184636 A1* | 6/2017 | Racz | H01L 43/06 |
| 2018/0299493 A1* | 10/2018 | Peccoux | G01R 15/207 |
| 2020/0191834 A1* | 6/2020 | Bilbao De Mendizabal | G01R 15/207 |

FOREIGN PATENT DOCUMENTS

| | | |
|---|---|---|
| EP | 3109658 A1 | 12/2016 |
| JP | 2005195427 A | 7/2005 |
| WO | 2012029439 A1 | 3/2012 |
| WO | 2015133621 A1 | 9/2015 |

OTHER PUBLICATIONS

European Search Report from EP Application No. EP19165398, dated Oct. 17, 2019.

* cited by examiner

*Primary Examiner* — Giovanni Astacio-Oquendo
(74) *Attorney, Agent, or Firm* — Workman Nydegger

(57) ABSTRACT

A current sensor device for measuring a current of at least 30 Amps, comprising: a leadframe with a electrical conductor having a centerline; a substrate mounted to the electrical conductor and comprising a first and a second magnetic sensor configured for providing a first and second value; and a processing circuit for determining the current based on a difference or weighted difference between the first and second value. The first and second magnetic sensor are arranged asymmetrically with respect to the centerline.

21 Claims, 9 Drawing Sheets

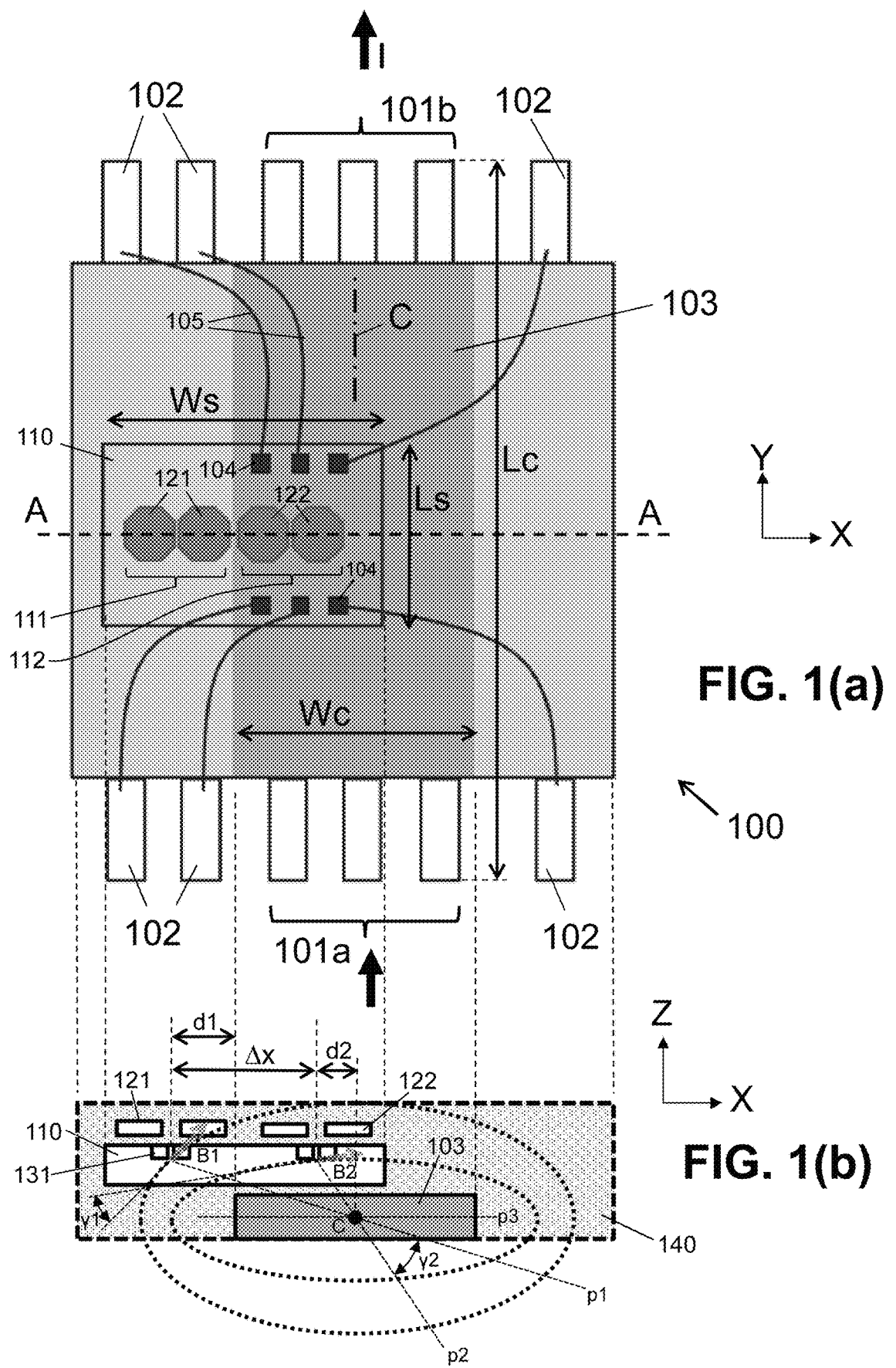

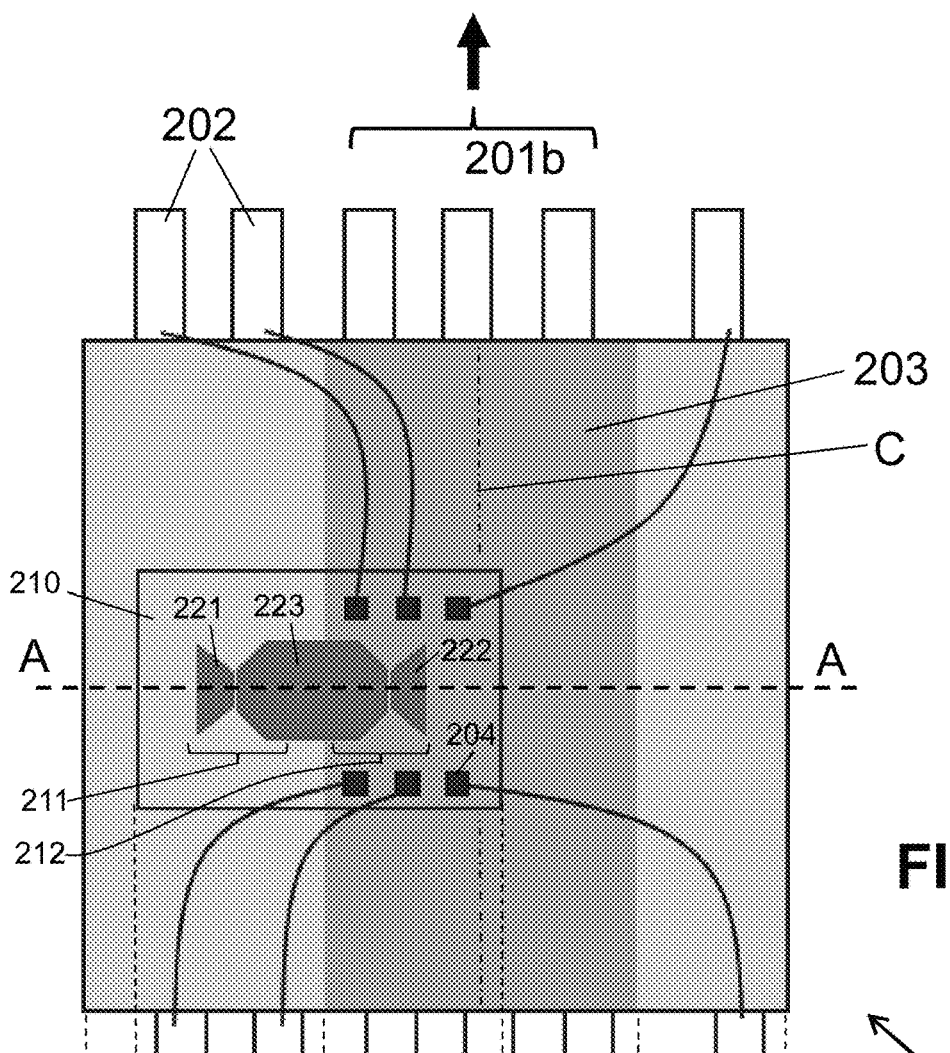
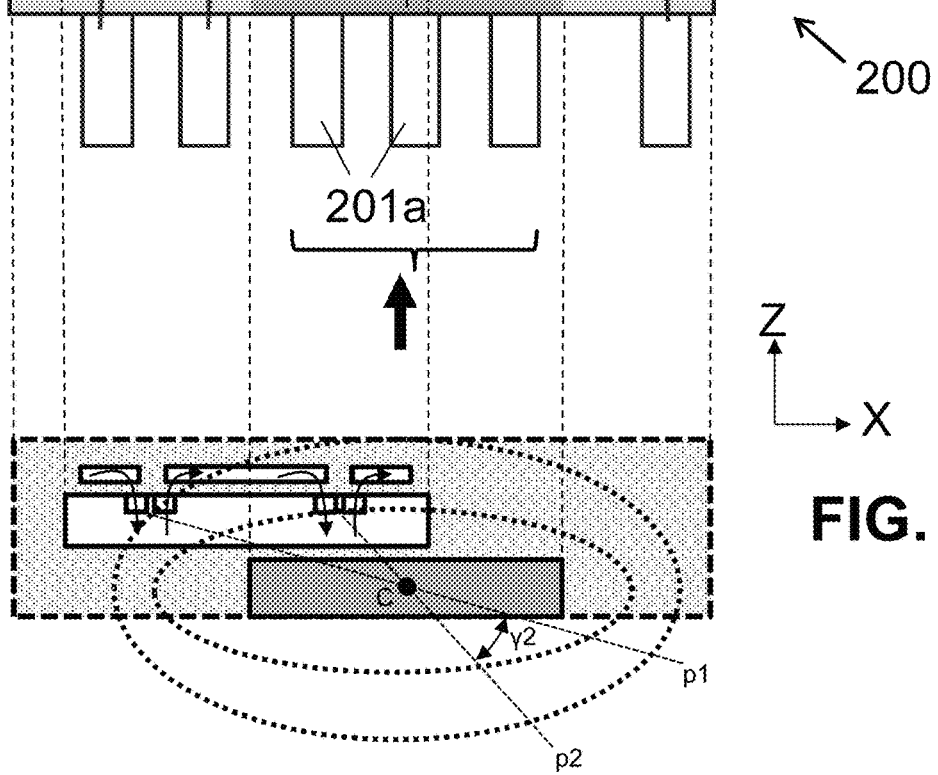

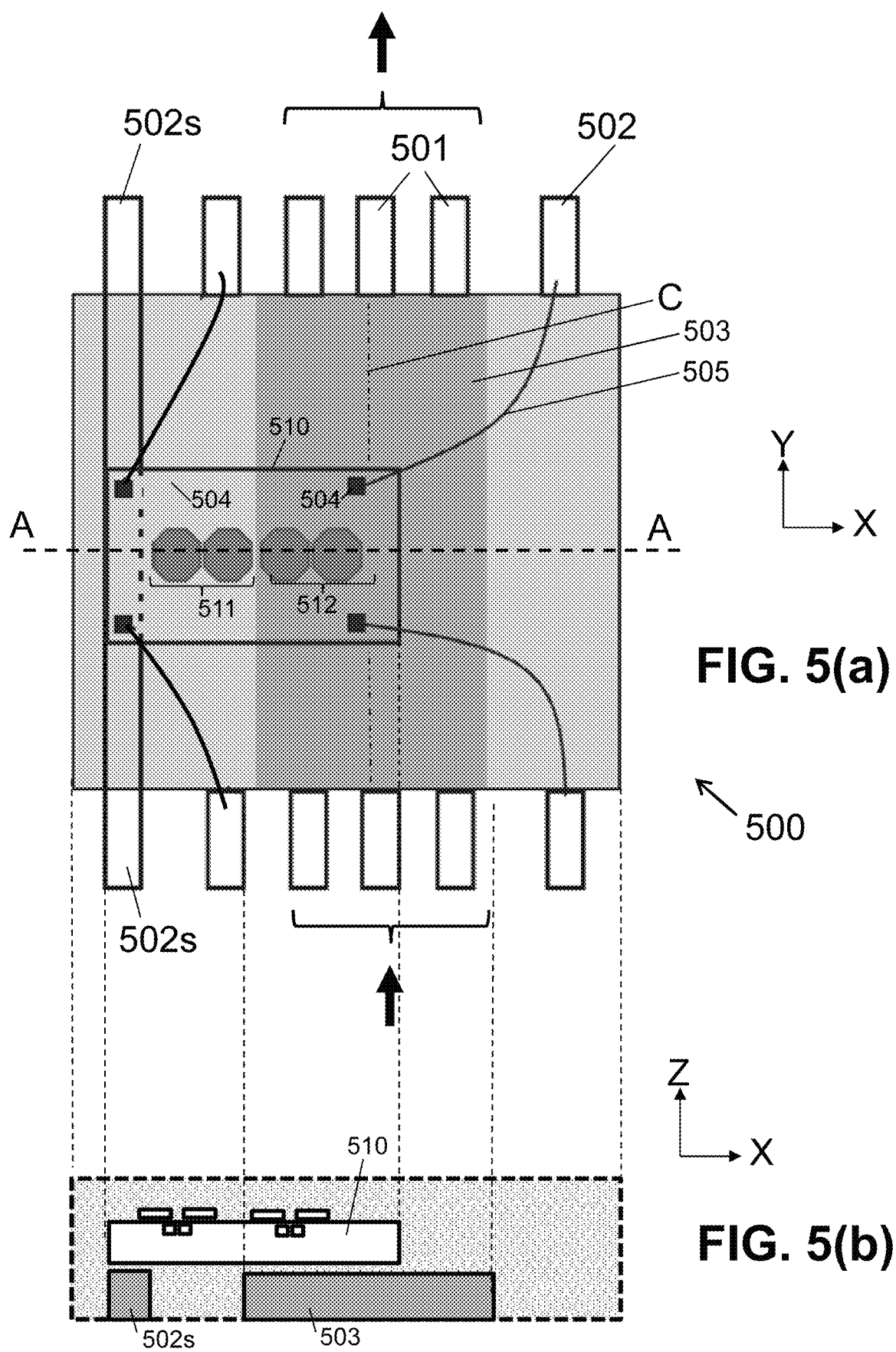

CURRENT SENSOR WITH INTEGRATED CURRENT CONDUCTOR

FIELD OF THE INVENTION

The present invention relates in general to the field of current sensors, and more in particular current sensors capable of measuring a relatively high current (e.g. at least 30 Amps).

BACKGROUND OF THE INVENTION

Current sensors based on magnetic sensors for measuring relatively high currents (e.g. at least 25 Amps) exist. They typically measure a current flowing in an external conductor. A problem of such a current sensor system is that the accuracy of the measurement largely depends on the mounting tolerances of the sensor device relative to the electrical conductor. While it is possible to increase accuracy by performing a calibration test at system level (e.g. after the sensor chip is mounted on a PCB), this is highly inconvenient, subject to human error, time consuming and costly.

There is always room for improvements or alternatives.

SUMMARY OF THE INVENTION

It is an object of embodiments of the present invention to provide a current sensor capable of measuring a relatively high current (e.g. a current of at least 30 Ampères).

It is also an object of embodiments of the present invention to provide an "integrated current sensor device" (i.e. having an electrical conductor incorporated inside the device), and capable of measuring a relatively high current (e.g. a current of at least 30 Ampères).

It is also an object of embodiments of the present invention to provide such a current sensor which is highly compact.

It is also an object of embodiments of the present invention to provide such a current sensor which is highly insensitive to an external disturbance field (also known as "strayfield").

It is also an object of embodiments of the present invention to provide a current sensor which is highly accurate without needing a calibration test at PCB-level (e.g. by an OEM-customer).

It is also an object of embodiments of the present invention to provide a current sensor which is easy to produce.

It is also an object of embodiments of the present invention to provide a current sensor, which can be mounted on a PCB with reduced mounting tolerances without sacrificing accuracy.

It is also an object of embodiments of the present invention to provide a current sensor comprising a semiconductor die, and capable of measuring a relatively high current (e.g. a current of at least 30 Ampères), without (significantly) increasing the die size, and without (significantly) decreasing the accuracy.

It is an object of embodiments of the present invention to provide a current sensor comprising an integrated electrical conductor, and a semiconductor die smaller than 7 $mm^2$, and capable of measuring a current of at least 40 Ampères.

It is also an object of embodiments of the present invention to provide such a current sensor which has a longer lifetime inter alia because it is less sensitive to cracks or micro-cracks.

These and other objects are accomplished by a current sensor device according to embodiments of the present invention.

In a first aspect, the present invention provides a current sensor device for measuring a current, comprising: a leadframe comprising a first portion (e.g. high power portion) comprising first leads (e.g. first input leads and first output leads) connected or shaped so as to form an electrical conductor adapted to carry the current to be measured, and a second portion (e.g. low power portion) comprising a plurality of second leads; a substrate comprising or connected to at least a first magnetic sensor and comprising or connected to a second magnetic sensor, the first and second magnetic sensor forming a first magnetic sensor pair; wherein the first magnetic sensor has a first axis of maximum sensitivity, and the second magnetic sensor has a second axis of maximum sensitivity parallel to the first axis; wherein the first magnetic sensor is located at a first location and is configured for providing a first value indicative of a first magnetic field component at said first location; wherein the second magnetic sensor is located at a second location and is configured for providing a second value indicative of a second magnetic field component at said second location; wherein a magnetic field induced by the current to be measured, when flowing through the electrical conductor, defines a first magnetic field vector at the first sensor location, and defines a second magnetic field vector at the second sensor location, the first magnetic field vector and the second magnetic field vector defining crossing or intersecting lines; a processing circuit connected to the first and second magnetic sensor, and adapted for determining the current to be measured at least based on a difference or a weighted difference between the first value and the second value obtained from the first sensor pair; and wherein the electrical conductor has a centerline, and a first distance between the centerline and the first sensor location is different from a second distance between the centerline and the second sensor location; and wherein the first and second sensor location are situated such that one or more of the following conditions is satisfied: i) a projection of the first sensor location perpendicular to a plane parallel to the electrical conductor (or otherwise stated parallel to a plane containing the electrical conductor), is located outside of the electrical conductor, and a projection of the second sensor location perpendicular to said plane is located inside the electrical conductor; ii) an angle defined by the first magnetic field vector at the first sensor location and the second magnetic field vector at the second sensor location is an angle in the range from 70° to 110°; iii) an angle between a first virtual plane containing the centerline and the first sensor location, and a second virtual plane containing the centerline and the second sensor location is an angle in the range from 30° to 110°, or from 40° to 110°, or from 50° to 110°, or from 60° to 110°, or from 70° to 110°, or from 80° to 100°, or from 50° to 88°, or from 60° to 88°, or from 30° to 80°, or from 30° to 88°.

It is an advantage of calculating the current based on a difference between two sensors having parallel axes of maximum sensitivity, because this allows to determine the current in a manner which is substantially stray field immune. It is an advantage of calculating the current based on a weighted difference, because it additionally allows to compensate for sensitivity-mismatch.

It is a major advantage of integrating the electrical conductor, because it allows a highly accurate positioning of the substrate (and thus the magnetic sensors) relative to the electrical conductor, in contrast to a system comprising a current sensor device which is mounted in the vicinity of an external electrical conductor, for example on a PCB (printed circuit boards). The positioning tolerances of an integrated current sensor are typically an order of magnitude more accurate than positioning tolerances of a chip on a PCB, or on an electrical conductor. In addition, the distance between the sensor location and an integrated current conductor is typically also at least a factor of 2 smaller than the distance between the sensor location and an external current conductor, and when taking into account that the magnetic field strength typically decreases with 1/r and the magnitude of a magnetic field gradient typically decreases with 1/(r*r), typically the SNR is at least a factor of 4 improved over solutions using an external current conductor. Both the smaller tolerances and the smaller distance provide that a current sensor with an integrated or embedded electrical conductor has a much higher accuracy than a current sensor mounted to an external electrical conductor.

It is a major advantage of locating the first and second sensor as described in terms of their projected position, or in terms of their distances relative to the centerline of the electrical conductor, which in simple terms could be interpreted as: located on opposite sides of one conductor edge, rather than on or near the opposite sides of the electrical conductor, because it decouples the relationship between the substrate width and the conductor width, or in other words, it allows the substrate size (or die size) to be chosen smaller than the conductor width, which is not possible in solutions where the sensors are located near opposite edges of the current conductor. This advantage should not be underestimated, because the cost of a (e.g. semiconductor) substrate constitutes a significant portion of the total cost of the current sensor, while (for a given material, and a given thickness of the electrical conductor and for a given maximum current to be measured), the width of the electrical conductor determines the electrical resistance of the conductor, and thus the heat dissipation (Joule dissipation), and thus the maximum current which can be measured with the integrated current sensor.

It is an advantage of this current sensor device that it is capable of measuring said current based on the measurement of a magnetic field gradient (e.g. ΔBx/Δx).

It is an advantage of calculating the current (to be measured) based on a difference between values provided by two sensors having parallel axes of maximum sensitivity, because this allows to determine the current in a manner which is substantially stray field immune.

It is a major advantage of integrating the electrical conductor, because it allows a highly accurate positioning of the substrate relative to the electrical conductor, in contrast to a system comprising a current sensor device which is mounted in the vicinity of an external electrical conductor, for example on a PCB (printed circuit board). The positioning tolerances of an integrated current sensor are typically an order of magnitude more accurate than positioning tolerances of a chip on a PCB, or on an electrical conductor. All other aspects remaining the same, this means that a current sensor with an embedded electrical conductor has a much higher accuracy than a current sensor mounted to an external electrical conductor, unless additional measures are taken, such as a calibration test by the end customer in the application.

It is a major advantage of locating the second sensor "above or below" the electrical conductor (or stated as: "such that its projection in a direction perpendicular to the conductor plane, is a location "on" the electrical conductor), and the first sensor is "outside" of the electrical conductor (such that its perpendicular projection is "not located on" the electrical conductor), because it decouples the relationship between the substrate width and the conductor width, or in other words, it allows the substrate size (or die size) to be chosen smaller than the conductor width, which is not possible in solutions where the sensors are located near opposite edges of the current conductor. This advantage should not be underestimated, because the cost of the substrate constitutes a significant portion of the total cost of the current sensor, while (for a given material, and a given thickness of the electrical conductor and for a given maximum current to be measured), the width of the electrical conductor determines the electrical resistance of the conductor, and thus the heat dissipation (Joule dissipation).

The present invention is partly based on the insight that the width of the electrical conductor can be increased (and thus the electrical resistance decreased, or the maximum allowable current increased) without significantly deteriorating the accuracy of the current measurement, and without significantly increasing the die size, and thus the cost.

In an embodiment, the current to be determined is based on a weighted difference of the first value (v1) and the second value (v2), and the respective weight factors (A, B) are chosen such that a uniform external magnetic field is cancelled. The weight factors may for example be determined during a calibration test and stored in a non-volatile memory and retrieved from the non-volatile memory during actual use.

The current sensor device may be produced for example by: a) providing the leadframe comprising the electrical conductor; b) optionally providing an insulating material on the electrical conductor; c) mounting a substrate on the electrical conductor or on the insulating material; d) electrically connecting the second leads and the substrate (e.g. by applying bond wires); e) overmolding the leadframe and the substrate.

The first leads may comprise one or more (primary current) first input leads and one or more (primary current) first output leads. The plurality of second leads may also be referred to as "low-voltage leads" or "signal leads".

With "the first and second vector defining crossing or intersecting lines" is meant that the first vector is located on a first virtual line and the second vector is located on a second virtual line, and the first line and the second line are not parallel. Preferably the first and second vector define an angle in the range from 5° to 175° or in the range from 185° to 355°, or in the range from 70° to 110°.

The first sensor and the second sensor may be embedded in the substrate, or may be mounted to or mounted on, or deposited on said substrate. Alternatively, only the first sensor is embedded in the substrate, and the second sensor is embedded in a second substrate, connected to the first substrate, for example by means of bond wires.

The "electrical conductor" is the part of the leadframe that is galvanically connected to the first leads, including the first leads, and the electrical resistance of the electrical conductor is defined as the electrical resistance that would be measured between the first input leads and the first output leads.

The first input leads and the first output leads may be located on opposite sides of the device package, or on adjacent sides of the device package (for example forming an L-shape).

Such a current sensor device may be produced by a) providing the leadframe comprising the electrical conductor; b) optionally providing an insulating material on the electrical conductor; c) mounting a substrate on the electrical conductor or on the insulating material; d) electrically connecting the second leads and the substrate; e) overmolding the leadframe and the substrate.

The electrical conductor may have a beam shaped portion, but that is not absolutely required.

It is an advantage of embodiments wherein the conductor is substantially planar (e.g. beam shaped), and wherein the first and second sensor are adapted for measuring a magnetic field component substantially parallel to the plane defined by the conductor (e.g. Bx field) rather than the field component substantially perpendicular to the substantially planar field, because the magnitude of the Bx-component is substantially independent of the conductor width, in contrast to Bz which strongly depends on the conductor width. (with Bz is meant the field component substantially perpendicular to said plane).

The first and second magnetic sensor are arranged asymmetrically with respect to the centerline.

Preferably, the electrical conductor has an electrical resistance smaller than 0.80 mOhm, or smaller than 0.60 mOhm, or smaller than 0.50 mOhm, or smaller than 0.40 mOhm, or smaller than 0.30 mOhm, or smaller than 0.28 mOhm, or smaller than 0.26 mOhm.

It is an advantage that the electrical resistance is smaller than for example 0.30 mOhm, because it allows the current sensor device to conduct a current of at least 30 Amperes through the (integrated) electrical conductor (with peak currents up to 100 Amps or even 120 Amps).

In an embodiment, each of the first and second magnetic sensor comprises at most one or at least one or at least two Horizontal Hall element and at least one or two integrated magnetic concentrators (IMC).

It is an advantage of using IMC because it transforms in-plane magnetic field components (often denoted by Bx or By) into an out-of-plane magnetic field component (often denoted by Bz), because the latter can be measured by a horizontal Hall element. It is a further advantage of using IMC because it provides passive signal amplification (typically by a factor of about 5 or 6). The IMC thickness is typically in the range from about 20 to 25 micron, e.g. equal to about 23 micron.

In an embodiment, the first and second magnetic sensor each comprise at least one vertical Hall element. The vertical Hall elements may be arranged to measure a magnetic field component (Bx), the field component Bx being oriented substantially parallel to the electrical conductor plane (if the electrical conductor is substantially planar), and in a direction perpendicular to the central line.

In an embodiment, the first and second magnetic sensor each comprise at least one magnetoresistance element.

The magnetoresistance element may comprise at least one of Indium Antimonide (InSb), a giant magnetoresistance (GMR) element, an anisotropic magnetoresistance (AMR) element, a tunnelling magnetoresistance (TMR) element or a magnetic tunnel junction (MTJ) element.

The at least one magnetoresistive element may be arranged in a bridge circuit. The magnetic sensor may further comprise a compensation coil, and a closed loop current sensing system. It is an advantage of such a closed loop current sensing system that it can reduce or substantially remove non-linearities.

In an embodiment, the leadframe is a copper leadframe having a thickness in the range from 100 to 600 micron, or from 200 to 500 micron, e.g. substantially equal to 200 micron, or substantially equal to 250 micron.

It is not trivial to build a current sensor device capable of measuring a current of at least 30 Amps or at least 40 Amps or at least 50 Amps using an internal conductor formed as part of the leadframe with a thickness in the range from 100 to 400 micron, or equal to about 200 or about 250 micron, inter alia because the classical manner to reduce the electrical conductance of an integrated conductor in current sensor devices is by increasing the thickness of the conductor while keeping the width of the conductor unchanged, because otherwise, if the width is increased and the thickness remains the same, the size of the substrate needs to increase (and thus also the cost).

In an embodiment, a first distance between an edge of the electrical conductor and the projection of the first sensor location is larger than 10% of a width of the electrical conductor; and/or wherein a second distance between the centerline of the electrical conductor and the projection of the second sensor location is smaller than 10% of a width of the electrical conductor.

It is an advantage of locating the first sensor relatively far from the electrical conductor edge, because this provides a relatively small first value of the magnetic field component, and thus a relatively large difference (or gradient) between the first and second value.

It is an advantage of locating the second sensor relatively close to the centerline, e.g. substantially in the middle of the conductor, e.g. from 40% to 60% in a transverse direction of the electrical conductor, because this provides a relatively large second value of the magnetic field component, and thus a relatively large difference (or gradient) between the first and second value.

If the electrical conductor is beam-shaped, the length is substantially parallel to the direction of the current flow, or in other words, is the direction from the first input leads to the first output leads (or vice versa). The width of a beam shaped conductor is perpendicular thereto. And the height of the beam shaped conductor is smaller than the length and smaller than the width.

If the electrical conductor is not beam-shaped, "the conductor width" is defined as the largest of a first line segment measured on a virtual line through the first sensor position and perpendicular to the centerline, and a second line segment measured on a virtual line through the second sensor position and perpendicular to the centerline.

In an embodiment, a distance between the first sensor location and the second sensor location is smaller than a width of the electrical conductor.

In an embodiment, a width Ws of the substrate is smaller than a width Wc of the electrical conductor.

In an embodiment, a distance between the first sensor location and the second sensor location is smaller than 80% of a width Wc of the electrical conductor, or smaller than 60% of Wc.

In an embodiment, a distance Δx between the first sensor location and the second sensor location is a value in the range from 1.0 mm to 3.0 mm, or in the range from 1.0 mm to 2.5 mm.

In an embodiment, the electrical conductor has a width Wc in the range from 1.0 mm to 7.0 mm; and/or the substrate has an area in the range from 1 to 5 mm$^2$.

In an embodiment the electrical conductor has a width of about 4.0±0.5 mm, and the substrate has a size of 2±0.5 mm by 3±0.5 mm.

Preferably the electrical conductor has a conductor portion with a constant cross section (in a plane perpendicular to the centerline) in close vicinity of the first and second magnetic sensor.

In an embodiment, the substrate has a first surface containing the first and second magnetic sensor, and the first surface is facing the electrical conductor; and the current sensor device further comprises an electrical isolating material located between the first surface of the substrate and the electrical conductor. The electrical isolating material may be a polyamide layer as part of the semiconductor die (e.g. CMOS device), or may be an electrically insulating tape applied between the leadframe and the semiconductor die.

It is an advantage of this embodiment that the distance between the magnetic sensors and the electrical conductor is relatively small, and that the signal measured by at least one or only one of the sensors is relatively large (e.g. larger than in case the second surface was facing the electrical conductor). This improves Signal-To-Noise ratio.

In this embodiment, the substrate is preferably mechanically supported at a first region or first end by the electrical conductor and the isolation material.

The substrate may additionally be mechanically supported at an opposite region or opposite end, or may be left floating on the other end, with a gap in between, which gap may be filled by air, or by a mold compound, or by insulation tape or another electrically isolating material (e.g. a suitable polymer).

In an embodiment, the substrate has a first surface containing the first and second magnetic sensor, and the first surface is facing the electrical conductor. The distance between the first surface and the electrical conductor may be a value in the range from 150 to 250 µm, or in the range from 170 to 210 µm, for example equal to about 190 micron.

In an embodiment, the electrical isolating material is adapted to withstand a voltage of at least 1000 Volt.

In an embodiment, the substrate has a first surface containing the first and second magnetic sensor, and the first surface is facing away from the electrical conductor.

In this embodiment, an electrical insulating material is not absolutely required between the electrical conductor and the substrate, but an electrical insulating material may optionally be present. In embodiments without electrical insulating material, the substrate may be positioned directly on top of the electrical conductor without additional isolation material in between. This is easier to produce (requires less material and less handling), and thus is faster and cheaper to produce.

The distance between the first surface of the substrate and the electrical conductor may be a value in the range from 300 to 400 µm, or in the range from 320 to 380 µm, for example equal to about 350 micron.

In embodiments where the substrate is separated from the electrical conductor by means of an electrically insulating tape, the distance between the substrate and the electrical conductor may be a value in the range from about 10 to 100 µm, or from 15 to 100 µm, or from 20 to 100 µm, or from 30 to 100 µm, or from 30 to 80 µm, or from 30 to 50 µm, for example equal to about 40 µm.

In an embodiment, the substrate further comprises a plurality of bond pads located on a portion of the substrate overlapping the electrical conductor; and the current sensor device further comprises a plurality of bond wires interconnecting one or more of the plurality of second leads and one or more of the plurality of bond pads.

In an embodiment, the bond pads are located only in a region of the substrate corresponding to a portion of the substrate which is mechanically supported underneath (i.e. is not left floating).

In an embodiment, the substrate further comprises a plurality of solder bumps connected to at least some of the second leads, but galvanically separated from the electrical conductor and from the first leads.

The galvanic separation may be implemented by a gap filled with air, or a gap filled with mold compound or a gap filled with an isolating material, e.g. an insulating tape, or the like.

In an embodiment, the electrical circuit comprises a differential amplifier configured for determining and amplifying said difference between the first value and the second value.

In an embodiment, the electrical circuit comprises an amplifier configured for selectively amplifying the first value and the second value, for example by means of a switch in front of the amplifier, and the two amplified signals may be temporarily stored (e.g. on one or more sample and hold circuits) and then subtracted.

In an embodiment, the first sensor signal may be amplified by a first amplifier, and the second sensor sensor may be amplified by a second amplifier, and the two amplified values may be subtracted from one another.

The sensor device may further comprise an analog-to-digital convertor ADC configured for digitizing the amplified difference signal (v1−v2), or for selectively digitizing the first amplified signal and the second amplified signal. The ADC may be part of a digital processor, for example a programmable microcontroller.

The current to be measured may be provided as an analog output signal proportional to the current, or may be provided as a digital signal, which may for example be output via a serial bitstream.

In an embodiment, the current sensor device further comprises a digital processor comprising or connected to a non-volatile memory storing at least one constant value (e.g. a conversion factor), and the digital processor is adapted for determining the current to be measured based on a difference or weighted difference between the first value and the second value and based on said constant value.

The digital processor may have an input connected to an output of the differential amplifier, in which case the digital processor may be adapted for digitizing the difference signal, and for multiplying the digitized value by said constant value K, for example according to the formula: I=K·(ΔV), where ΔV is the digitized difference signal.

Alternatively, the subtraction may be performed in the digital domain. The digital processor may have an input connected to an output of the amplifier, and the digital processor may be adapted for selectively digitizing each of the first amplified signal and the second amplified signal, to perform the subtraction in the digital domain, and to multiply the result by said constant value K to obtain a result which is indicative of the current to be measured, for example according to the formula: I=K·(V1−V2), where V1 is a digitized value of the (optionally amplified) first signal, and V2 is a digitized value of the (optionally amplified) second signal.

In a variant, the digital processor may be adapted to calculate the current using the formula: 1=(A·V1)−(B·V2), where "A" is a first amplification factor (analog or digital) and "B" is a second amplification factor (analog or digital). This embodiment offers the advantage that it can correct for sensitivity mismatch. The value of A and B may be stored in a non-volatile memory, and may be determined during calibration, or in any other suitable way.

In an embodiment, the substrate further comprises at least one temperature sensor configured for measuring at least one temperature related to a temperature of the first magnetic sensor and/or the second magnetic sensor, the at least one temperature sensor being connected to the digital processor; and the digital processor is adapted for calculating the current to be measured based on a difference or weighted difference between the first value and the second value, and taking into account the at least one measured temperature.

It is an advantage of this current sensor that it includes a temperature compensation mechanism. In this way, the accuracy of the current measurement can be further improved.

In an embodiment, the substrate further comprises a first temperature sensor and a second temperature sensor, the first temperature sensor being configured for measuring a first temperature T1 of the first magnetic sensor, and the second temperature sensor being configured for measuring a second temperature T2 of the second magnetic sensor, the first temperature sensor and the second temperature sensor being connected to the digital processor; and the digital processor is adapted for calculating the current to be measured based on a difference or weighted difference between the first value v1 and the second value v2, and taking into account the first temperature and the second temperature.

It is a major advantage of this embodiment that the temperature of each magnetic sensor is measured separately, because the temperature of the first and second magnetic sensor may be substantially different, especially if a relatively high current (e.g. larger than 30 Amps) is being measured, because such a high current typically causes the electrical conductor to warm up significantly, causing a relatively large temperature gradient over the substrate. By measuring and taking into account both temperatures, the accuracy of the current measurement can be further improved. Moreover, the temperature sensor(s) may also be used to detect whether the device is working in its specified operational range. If not, the sensor device may report an error, which error may be used for safety purposes.

In an embodiment, the first magnetic sensor comprises at least a first horizontal Hall element, and the first temperature sensor is substantially surrounding the first horizontal Hall element, and the second magnetic sensor comprises at least a second horizontal Hall element, and the second temperature sensor is substantially surrounding the second horizontal Hall element.

The temperature sensor may be arranged around the horizontal Hall elements in a manner similar as described in patent document EP3109658A1, with or without a stress sensor.

In an embodiment, the substrate further comprises at least one stress sensor configured for measuring at least one stress value related to mechanical stress experienced by the first magnetic sensor, the at least one stress sensor being (e.g. communicatively) connected to the digital processor; and the digital processor is adapted for calculating the current to be measured based on a difference or weighted difference between the first value and the second value, and taking into account the at least one measured stress value.

The stress sensor may be arranged around the horizontal Hall element in a manner similar as described in patent document EP3109658A1, but without a temperature sensor.

It is an advantage of this current sensor that it includes a stress compensation mechanism. In this way, the accuracy of the current measurement can be further improved.

In an embodiment, the substrate further comprises a first stress sensor and a second stress sensor, the first stress sensor being configured for measuring a first stress at the first sensor location, and the second stress sensor being configured for measuring a second stress at the second sensor location, the first stress sensor and the second stress sensor being connected to the digital processor, and the digital processor is adapted for calculating the current to be measured based on a difference or weighted difference between the first value v1 and the second value v2, and taking into account the first stress and the second stress.

It is a major advantage of this embodiment that the (mechanical) stress of each magnetic sensor is measured separately, because the stress exerted upon the first and the second magnetic sensor may be substantially different, especially if a relatively high current (e.g. larger than 30 Amps) is being measured, because such a high current typically causes the electrical conductor to warm up significantly, causing a relatively large temperature gradient, causing mechanical stress (related to different thermal expansion coefficients of the different materials). In this way the accuracy of the current measurement can be further improved.

In an embodiment, the substrate further comprises a first temperature sensor and a first stress sensor surrounding the first magnetic sensor, and a second temperature sensor and a second stress sensor surrounding the second magnetic sensor, the first temperature sensor and the first stress sensor and the second temperature sensor and the second stress sensor being (e.g. communicatively) connected to the digital processor; and wherein the digital processor is adapted for calculating the current to be measured based on a difference between the first value (optionally amplified with or multiplied by a first factor A) and the second value (optionally amplified with or multiplied by a second factor B), and taking into account the first and second temperature and the first and second stress, where the factors A and B may be chosen to compensate for sensitivity mismatch.

The temperature sensor and stress sensor may be arranged around the first and second magnetic sensor in a manner similar as described in patent document EP3109658A1. In this way the accuracy of the current measurement can be further improved.

In an embodiment, the current value determined by the processing circuit based on the first and second magnetic sensor is considered as a first current value; and the substrate further comprises a third magnetic sensor arranged in a similar manner as the first magnetic sensor and configured for measuring a third value, and further comprises a fourth magnetic sensor arranged in a similar manner as the second magnetic sensor and configured for measuring a fourth value; and the processing circuit is further connected to the third magnetic sensor for obtaining the third value, and to the fourth magnetic sensor for obtaining the fourth value, and is further adapted for determining a second current value based on a difference or a weighted difference between the third value and the fourth value; and is further adapted for comparing the second current value and the first current value, and if a difference or ratio between the first and second current value satisfies a predetermined condition (e.g. lies within or outside a predefined range), to provide an average of the first current value and the second current value as the current value to be measured. Alternatively, either the first current value or the second current value may be provided as "the" current value.

The third and fourth magnetic sensor may comprise a third and a fourth horizontal Hall element, forming a second pair of magnetic sensors. The sensor elements of the second pair may be located at substantially the same distance from the centerline as the sensor elements of the first pair, but that is not absolutely required.

This embodiment may use four magnetic sensors for redundancy purposes and/or for "functional safety" purposes. In case the first and second current value are substantially the same, the average of these currents is provided, which further improves the accuracy.

In case the first and second value deviate too much (more than a predefined value or more than a predefined percentage), the current sensor device may provide an error signal, for example an analog error signal via one of the second leads, or a digital error value in a serial data stream via one of the second leads.

In a particular embodiment, the leadframe is a copper leadframe having a thickness in the range from 100 to 600 micron; and the first leads comprise first input leads located on one side of the device, and first output leads located on another side of the device opposite the first side; and the electrical conductor comprises a substantially planar and substantially beam shaped interconnection portion having a length spanning substantially the entire distance between the first input leads and the first output leads; and the electrical conductor has an electrical resistance smaller than 0.80 mOhm; and the beam shaped interconnection portion has a width in the range from 1.0 mm to 7.0 mm; and the semiconductor substrate comprises said first magnetic sensor and said second magnetic sensor and said processing circuit integrated or embedded in said substrate; and the width (Ws) of the substrate is smaller than the width (Wc) of the beam shaped interconnection portion; and the projection of the first sensor location perpendicular to the plane (XY) defined by the length and the width direction of the beam shaped interconnection portion is located outside of the beam shaped interconnection portion, and the projection of the second sensor location perpendicular to said plane is located on the beam shaped interconnection portion; and the current sensor device is overmoulded so as to form a packaged current sensor device.

In this embodiment, the beam shaped interconnection portion forms a major part of the electrical conductor. This embodiment has the combination of advantages mentioned above (e.g. high accuracy, insensitive to external strayfield, good SNR, capable of measuring high currents, low electrical resistance, low heat generation, etc.). In addition, this current device is highly compact, has a high mechanical robustness or rigidity, and has a relatively low material cost (inter alia thanks to the small size of the semiconductor substrate).

A major advantage of this device is that it has a longer lifetime due to a reduced tendency to cracks or micro-cracks caused by temperature variations due to Joule heating, in contrast to prior art devices having a curved conductor portion.

According to a second aspect, the present invention also provides a method of manufacturing a current sensor device for measuring a current, the method comprising the steps of: a) providing a leadframe comprising a first portion (e.g. high power portion) comprising first leads (e.g. first input leads and first output leads) connected or shaped so as to form an electrical conductor adapted to carry the current to be measured, and a second portion (e.g. low power portion) comprising a plurality of second leads; b) providing a substrate comprising or connected to at least a first magnetic sensor and comprising or connected to a second magnetic sensor, the first magnetic sensor having a first axis of maximum sensitivity, and the second magnetic sensor having a second axis of maximum sensitivity parallel to the first axis; the first magnetic sensor located at a first location and configured for providing a first value indicative of a first magnetic field component at said first location; the second magnetic sensor located at a second location and configured for providing a second value indicative of a second magnetic field component at said second location; wherein a magnetic field induced by the current to be measured, when flowing through the electrical conductor, defines a first magnetic field vector at the first sensor location, and defines a second magnetic field vector at the second sensor location, the first magnetic field vector and the second magnetic field vector defining crossing or intersecting lines; c) mounting the substrate relative to the leadframe such that a first distance between the centerline and the first sensor location is different from a second distance between the centerline and the second sensor location; and such that the first and second sensor location are situated such that one or more of the following conditions is satisfied: i) a projection of the first sensor location perpendicular to a plane parallel to the electrical conductor (or otherwise stated parallel to a plane containing the electrical conductor), is located outside of the electrical conductor, and a projection of the second sensor location perpendicular to said plane is located inside the electrical conductor; ii) an angle defined by the first magnetic field vector at the first sensor location and the second magnetic field vector at the second sensor location is an angle in the range from 70° to 110°; iii) an angle between a first virtual plane containing the centerline and the first sensor location, and a second virtual plane containing the centerline and the second sensor location is an angle in the range from 70° to 110°, or from 80° to 100°, or from 50° to 88°, or from 60° to 88°; d) providing a processing circuit connected to the first and second magnetic sensor, and adapted for determining the current to be measured at least based on a difference or a weighted difference between the first value and the second value obtained from the first sensor pair; wherein the electrical conductor has a centerline;

The processing circuit may be embedded on the same substrate as the first magnetic sensor and/or the second magnetic sensor, in which case step d) may be comprised in step b).

According to a third aspect, the present invention also provides a current sensor device for measuring a current, comprising: a leadframe comprising a first portion (e.g. high power portion) comprising first leads (e.g. first input leads and first output leads) connected or shaped so as to form an electrical conductor adapted to carry the current to be measured; a substrate comprising or connected to at least a first magnetic sensor and comprising or connected to a second magnetic sensor; the first and second magnetic sensor forming a first magnetic sensor pair; wherein the first magnetic sensor has a first axis of maximum sensitivity, and the second magnetic sensor has a second axis of maximum sensitivity parallel to the first axis; wherein the first magnetic sensor is located at a first location and is configured for providing a first value indicative of a first magnetic field component of a magnetic field induced by said current at said first location; wherein the second magnetic sensor is located at a second location and is configured for providing a second value indicative of a second magnetic field component of said magnetic field at said second location, a processing circuit connected to the first and second magnetic sensor, and adapted for determining a magnetic field gradient of said magnetic field at least based on a weighted difference between said first value and a said second value, where the respective weight factors are chosen such that a uniform external magnetic field is cancelled.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1(a) and FIG. 1(b) show an exemplary block diagram of a current sensor device according to a first embodiment of the present invention, in top view and in cross sectional view respectively.

FIG. 2(a) and FIG. 2(b) show an exemplary block diagram of a current sensor device according to a second embodiment of the present invention, in top view and in cross sectional view respectively.

FIG. 5(a) and FIG. 5(b) show an exemplary block diagram of a current sensor device according to a fifth embodiment of the present invention, in top view and in cross sectional view respectively.

Figure 1C:
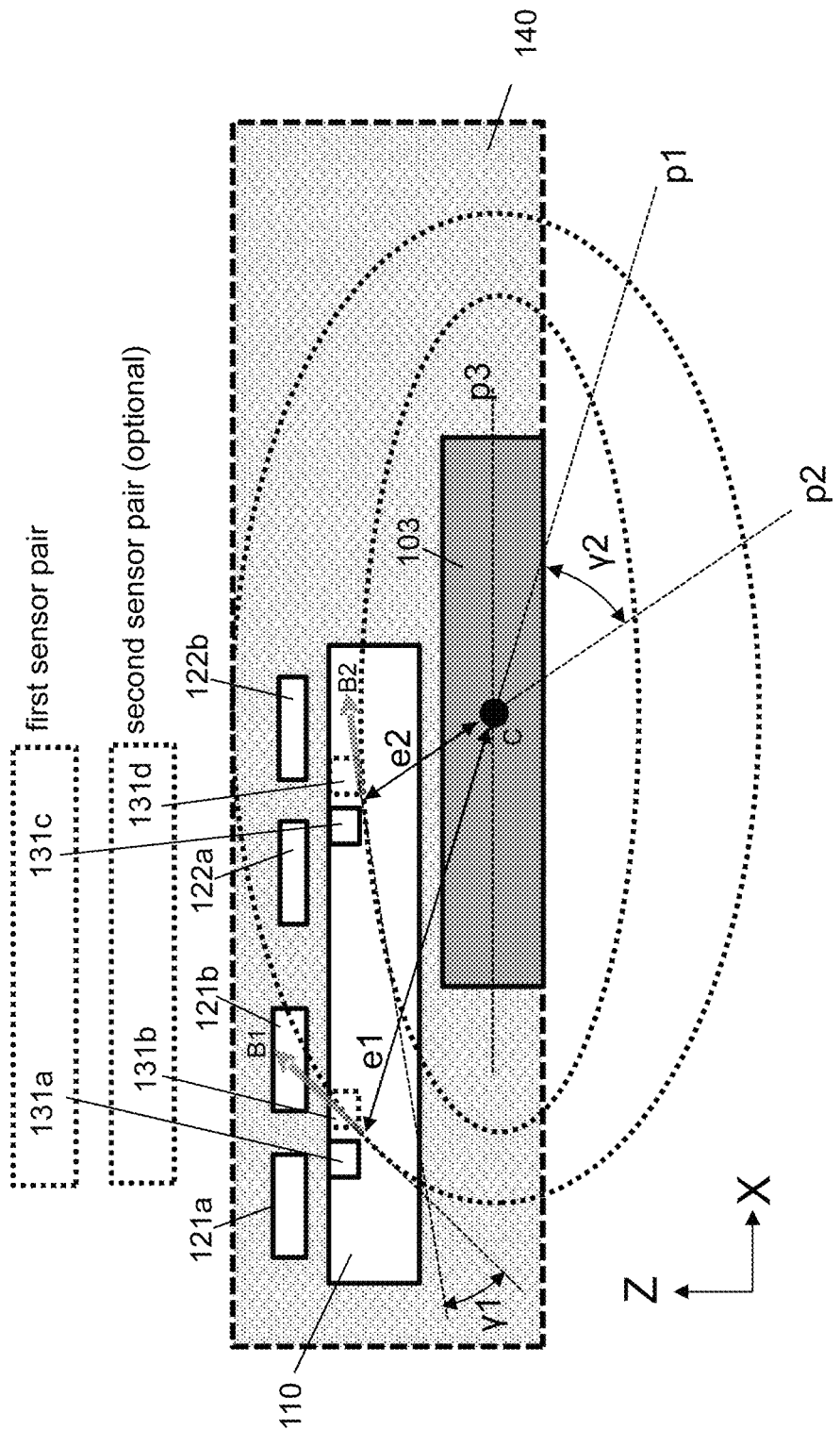
FIG. 1(c) shows an enlarged view of FIG. 1(b).

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the terms "centerline" and "heart line" are used as synonyms.

The term "magnetic sensor" as used herein may refer to one or more sensor elements capable of measuring one or more magnetic effects, such as the Hall effect, or magnetoresistive (MR) effects. Non-limiting examples for magnetoresistive effects include GMR (giant magnetoresistance), CMR (colossal magnetoresistance), AMR (anisotropic magnetoresistance) or TMR (tunneling magnetoresistance). Depending on the context, the term "magnetic sensor" may refer to a single magnetic sensitive element (e.g. a Horizontal Hall element or a Vertical Hall element), or to a group of magnetic elements (e.g. arranged in a Wheatstone bridge, or to a group of at least two Hall sensor elements connected in parallel), or to a sub-circuit further comprising one or more of: a biasing circuit, a readout circuit, an amplifier, an Analog-to-Digital converter, etc.

The term "integrated current sensor" as used herein refers to an integrated circuit (chip or IC) comprising an electrical conductor capable of conducting the entire current to be measured. The electrical conductor is typically at least partially surrounded by a mold compound (e.g. in a manner wherein at most one surface is exposed). Such an overmoulded device is also referred to herein as a "packaged device".

When reference is made to "width of the electrical conductor", what is meant (in general) is "the local transverse dimension of the electrical conductor at each point of the centerline in a plane perpendicular to the centerline and parallel to the plane defined by the leadframe" unless clear from the context that something else is meant. For the special case of a beam-shaped electrical conductor, the length simply means the dimension between the first and second leads (in which the current will flow during normal use), and the width simply means the dimension of the conductor transverse to this direction.

When reference is made to "weighted difference", what is meant is a difference between two values after one or both of the values are multiplied by a respective factor. In the context of the present invention, what is meant with "weighted difference of value V1 and value V2" is a value V calculated as A*V1−B*V2, where A and B are predefined constants, V1 is the first value, and V2 is the second value.

The present invention relates to current sensors based on magnetic sensors, also referred to as "magnetic current sensors", more in particular for use in automotive applications (e.g. for measuring a current in electrical or hybrid vehicles). The current sensor has to be capable of measuring currents of at least 30 Ampère DC with peaks of up to 100 Ampère or up to 120 Ampère.

The present invention proposes a current sensor device for measuring a current. The device comprises a leadframe. The leadframe comprises a first portion (e.g. high power portion) comprising first leads (e.g. first input leads and first output leads) connected or shaped so as to form an electrical conductor adapted to carry the current to be measured, and a second portion (e.g. low power portion) comprising a plurality of second leads. The device further comprises at least one substrate (e.g. a single semiconductor die, or two semiconductor dies, or a multi-die). The substrate may be mounted at a predefined position with respect to the electrical conductor. The substrate comprises or is connected to at least a first magnetic sensor and comprises or is connected to a second magnetic sensor. Each magnetic sensor may comprise one or more sensing elements, and/or an excitation circuit, and/or a readout-circuit. The first magnetic sensor has a first axis of maximum sensitivity, and the second magnetic sensor has a second axis of maximum sensitivity. The first and second magnetic sensor are arranged such that the first axis of maximum sensitivity is parallel to the second axis of maximum sensitivity. The first magnetic sensor is located at a first location and is configured for providing a first value indicative of a first magnetic field component (e.g. an in-plane field component in the plane of the substrate, or in an orthogonal direction to said substrate surface) at said first location. The second magnetic sensor is located at a second location. The second location may be spaced from the first location. The second magnetic sensor is configured for providing a second value indicative of a second magnetic field component (e.g. an in-plane field component in the plane of the substrate or in a virtual plane orthogonal to the plane of the substrate) at said second location. The magnetic field induced by the current to be measured, when flowing through the electrical conductor, defines a first magnetic field vector at the first sensor location, and defines a second magnetic field vector at the second sensor location. The first magnetic field vector and the second magnetic field vector are not parallel, or in other words, define crossing or intersecting lines. The current sensor device further comprises a processing circuit. The processing circuit may be integrated on the substrate comprising the first magnetic sensor and/or the second magnetic sensor, or on another substrate. The processing circuit is connected to the first magnetic sensor for obtaining the first value, and is connected to the second magnetic sensor for obtaining the second value, and is adapted or configured for determining the current to be measured based on a difference or weighted difference between the first value and the second value. The electrical conductor has a centerline. The electrical conductor may have a relatively short or a relatively long beam shaped portion, or even an infinitesimal small beam-shaped conductor portion. In such embodiments, the current to be measured flows in a direction substantially parallel to said centerline and significantly perpendicular to a transversal cut of said leadframe, or otherwise stated parallel to a plane containing the electrical conductor. The current to be measured, when flowing in the electrical conductor, flows in a direction substantially parallel to the centre line. The first and second sensor location are situated asymmetrically with respect to the centerline. More in particular, the first and second sensor location may be situated such that one or more of the following conditions is satisfied: i) a projection of the first sensor location perpendicular to a plane parallel to the electrical conductor is located outside of the electrical conductor, and a projection of the second sensor location perpendicular to said plane is located inside the electrical conductor; ii) an angle γ1 defined by the first magnetic field vector B1 at the first sensor location and the second magnetic field vector B2 at the second sensor location is an angle in the range from 70° to 110°; iii) an angle γ2 between a first virtual plane containing the centerline and the first sensor location, and a second virtual plane containing the centerline and the second sensor location is an angle in the range from 70° to 110°.

It is an advantage of this current sensor device that it is capable of measuring said current based on the measurement of a magnetic field gradient (e.g. $\Delta Bx/\Delta x$).

It is an advantage of calculating the current in this way, because this allows to determine the current in a manner which is substantially stray field immune.

It is a major advantage of integrating the electrical conductor, because it allows a highly accurate positioning of the substrate relative to the electrical conductor, in contrast to a system with a current conductor mounted in the vicinity of an external electrical conductor, for example on a PCB (Printed Circuit Board). The positioning tolerances of an integrated current sensor are typically an order of magnitude more accurate than positioning tolerances of a chip on a PCB, or on an electrical conductor. All other aspects remaining the same, this means that a current sensor with an embedded electrical conductor has a much higher accuracy than a current sensor mounted to an external electrical conductor, unless additional measures are taken, such as a calibration test by the end customer in the application.

It is a major advantage of locating the first sensor above or below the electrical conductor, and the second sensor outside of the electrical conductor, because it decouples the relation between the substrate width and the conductor width, or in other words, it allows the substrate size (or die size) to be chosen smaller than the conductor width W, which is not possible in solutions where the sensors are located near opposite edges of the current conductor. This advantage should not be underestimated, because the cost of the substrate constitutes a significant portion of the total cost of the current sensor, while (for a given material, and a given thickness of the electrical conductor and for a given maximum current to be measured), the width of the electrical conductor determines the electrical resistance of the conductor, and thus the heat dissipation (Joule dissipation).

The electrical conductor may have an electrical resistance smaller than 0.50 mOhm, or smaller than 0.40 mOhm, or smaller than 0.30 mOhm, or smaller than 0.28 mOhm, or smaller than 0.26 mOhm, or smaller than 0.24 mOhm, or smaller than 0.22 mOhm, or smaller than 0.20 mOhm, to allow that the electrical conductor can carry a current of at least 30 A).

The present invention is partly based on the insight that the width of the electrical conductor can be increased (and thus the electrical resistance decreased, or the maximum allowable current increased) without significantly detoriating the accuracy of the current measurement, and without increasing the die size, and thus the cost, by this specific arrangement of the first and second current sensor. Further optional improvements are explained below.

Referring now to the figures.

FIG. 1(a) to FIG. 1(b) show an exemplary block diagram of a current sensor device 100 according to a first embodiment of the present invention, in top view and in cross sectional view respectively.

The current sensor device 100 comprises a leadframe 103 comprising a first portion (e.g. high-power portion) comprising first leads 101 connected or shaped so as to form an electrical conductor adapted to carry the current to be measured. In the example shown, a plurality of first input leads 101a and a plurality of first output leads 101b are interconnected by an electrical conductor 103 having a width Wc measured in a local transversal direction relative to a centerline of the electrical conductor. The electrical conductor may have a beam shaped portion, but that is not absolutely required. The beam shaped portion may extend over the entire distance between the first input leads 101a and the first output leads 101b. The leadframe further comprises a second portion (e.g. low power portion) comprising a plurality of second leads 102.

The current sensor device 100 further comprises a substrate 110 (e.g. a semiconductor substrate) mounted at a predefined position with respect to the electrical conductor, more in particular to the electrical conductor 103. The substrate 110 comprises at least a first magnetic sensor 111 and a second magnetic sensor 112. In the example of FIGS. 1(a) to 1(c), each sensor comprises two horizontal Hall elements and two integrated magnetic concentrator structures (IMC). In the example of FIGS. 1(a) to 1(c), the IMC structures have an octagonal shape, but that is not absolutely required for the invention to work. This arrangement allows to measure a magnetic field component (denoted as Bx) parallel to the substrate plane using horizontal Hall elements. Other embodiments may use other in plane sensor technologies such as XMR or vertical Hall plates. In other embodiments, horizontal hall plates may also be used to sense out-of-plane magnetic fields (often referred to as Bz-field).

The first magnetic sensor 111 has a first axis of maximum sensitivity and the second magnetic sensor 112 has a second axis of maximum sensitivity parallel to the first axis. This allows the signals to be combined (e.g. subtracted) in a manner which is substantially stray field immune.

The first magnetic sensor 111 is located at a first location and is configured for providing a first value v1 indicative of a first magnetic field component at said first location (e.g. B1x which is a projection of the magnetic field vector B1 on the X-axis).

The second magnetic sensor 112 is located at a second location spaced Δx apart from the first location and is configured for providing a second value v2 indicative of a second magnetic field component at said second location (e.g. B2x which is a projection of the magnetic field vector B2 on the X-axis).

When a current to be measured flows through the electrical conductor, more in particular through the electrical conductor 103, a magnetic field is generated, which is measured by the first and second magnetic sensor 111, 112. This magnetic field defines a first magnetic field vector B1 at the first sensor location and defines a second magnetic field vector B2 at the second sensor location. The first magnetic field vector B1 and the second magnetic field vector B2 are not parallel but define crossing or intersecting lines in a plane-view perpendicular to said centerline. Said intersecting lines in a plane-view perpendicular to said centerline, define an intersecting-angle that is in the range from 50° to 110° or from 75° to 105°.

The sensor circuit 100 further comprises a circuit, e.g. an electrical processing circuit (see e.g. FIG. 6 or FIG. 7) integrated on the substrate, and connected to the first magnetic sensor for obtaining the first value v1, and connected to the second magnetic sensor for obtaining the second value v2, and adapted for determining the current to be measured based on a difference or weighted difference between the first value v1 and the second value v2.

According to an important aspect of the present invention, the electrical conductor has an electrical resistance smaller than 0.80 mOhm, or smaller than 0.50 mOhm, or smaller than 0.40 mOhm, or smaller than 0.30 mOhm, or smaller than 0.28 mOhm, or smaller than 0.26 mOhm, including the electrical resistance of the first input leads 101a and first output leads 101b. This can be obtained by choosing a suitable leadframe material (e.g. copper) and a suitable length Lc and width Wc and leadframe thickness. Thanks to this low resistance value, the power dissipation caused by a current flowing through the electrical conductor can be limited, thus the temperature increase can be limited.

The electrical conductor has a centerline C. The first and second sensor location are situated such that one or more of the following conditions are satisfied: i) a projection of the first sensor location perpendicular to a plane p3 parallel to the electrical conductor 103 is located outside of the electrical conductor, and a projection of the second sensor location perpendicular to said plane p3 is located inside the electrical conductor 103; ii) an angle γ1 defined by the first magnetic field vector B1 at the first sensor location and the second magnetic field vector B2 at the second sensor location is an angle in the range from 70° to 110°; iii) an angle γ2 between a first virtual plane p1 containing the centerline C and the first sensor location, and a second virtual plane p2 containing the centerline C and the second sensor location is an angle in the range from 70° to 110°.

Placing the sensors at these specific locations allows to use a relatively small substrate, e.g. a substrate having a width Ws smaller than the width Wc of the electrical conductor, or such that a ratio of the substrate width Ws and the width Wc of the electrical conductor Ws/Wc is a value smaller than 90% or even smaller than 80% or smaller than 70% or smaller than 60%, or smaller than 40%.

One of the insights of the present invention is that the width of the substrate is not fully dependent on the width of the conductor, but a smaller width can be used. This has a direct impact on the price of the die, which is very important in a highly competitive market, such as automotive and industrial integrated current sensors.

In particular embodiments, the electrical conductor may have a width Wc in the range from 1.0 to 8.0 mm, or in the range from 2.0 to 6.0 mm, and the substrate may have a size of about of 2±0.5 mm by 3±0.5 mm).

The skilled person having the benefit of the present disclosure will understand that, at least in some embodiments, the closer the second sensor 112 to the centerline (the smaller the offset d2), the higher the second signal v2, and the further the first sensor 111 away from the edge of the electrical conductor (the larger the offset d1), the smaller the first signal v1, or vice versa, and thus the larger the difference signal v1−v2. This means that a skilled person having the benefit of the present disclosure can make a trade-off between accuracy and cost (related to the size of the substrate).

In some embodiments in order to overcome such trade-off, the first and/or second sensor may be on separate substrates to increase the distance between sensors while maintaining the overall silicon budget. In such embodiments, the first and/or second sensor may be connected to the processing unit via wire-bonding.

In particular embodiments, a distance between the centerline C of the electrical conductor 103 and the projection of the second sensor location is smaller than 10% or 20% of a width Wc of the electrical conductor 103, and a distance d1 between an edge of the electrical conductor 103 and the projection of the first sensor location is larger than 10% or 20% of the width Wc of the electrical conductor. It is an advantage of locating the second sensor 112 near the middle (e.g. from 40% to 60%) in the transverse direction X of the electrical conductor 103, because this provides a relatively large second value v2 of the magnetic field component Bx2. It is an advantage of locating the first sensor 111 relatively far from the electrical conductor 103, because this provides a relatively small first value v1 of the magnetic field component Bx1, and thus a relatively large difference (or gradient) between the first and second value v1, v2.

The leadframe may be a copper leadframe (e.g. made of copper C151) and/or having a thickness in the range from 100 to 600 micron or from 200 to 500 micron, e.g. substantially equal to 200 micron, or substantially equal to 250 micron. It is not trivial to build a current sensor device capable of measuring a current of at least 30 Amps or at least 40 Amps or at least 50 Amps using a leadframe with a thickness in the range from 100 to 600 micron, or equal to about 200 or about 250 micron, inter alia because the classical manner to reduce the electrical conductance of an integrated conductor in current sensor devices is by increasing the thickness of the conductor while keeping the width of the conductor unchanged, because otherwise, if the width is increased and the thickness remains the same, the size of the substrate needs to increase (and thus also the cost of the substrate).

In the example of FIGS. 1(a) and 1(b), the electrical conductor is connected to three input leads 101a and to three output leads 101b, but the present invention is not limited thereto, and the number of first input leads 101a and first output leads 101b may be more than three or less than three.

In the example of FIGS. 1(a) and 1(b), the first leads 101a, 101b have the same shape and size as the second leads 102, but the present invention is not limited thereto, and the three first input leads 101a may be replaced by a single, relatively broad input strip (not shown), and the three first output leads 101b may be replaced by a single, relatively broad output strip (not shown). In this way, the electrical resistance can be further decreased, and the thermal conductance (e.g. towards a PCB) may be improved.

The current sensor device 100 of FIG. 1(a) contains four horizontal Hall elements and four octagonal integrated magnetic concentrators, but the present invention is not limited thereto, and other magnetic sensors can also be used.

For example, in FIG. 2(a) and FIG. 2(b) the first and second magnetic sensor are also based on horizontal Hall elements with IMC, but the shape of the two outer magnetic concentrators 221, 222 is changed, and the inner two magnetic concentrators are combined so as to form a common magnetic concentrator 223.

Figure 3A:
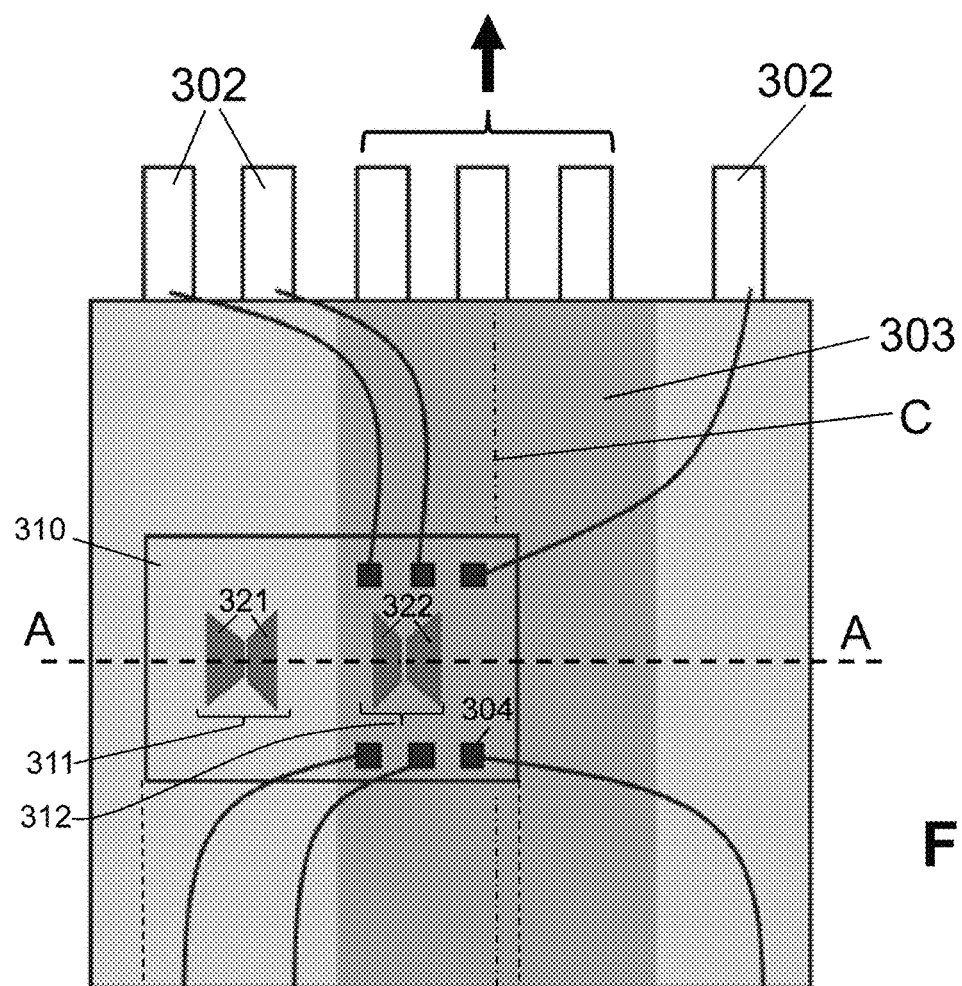
FIG. 3(a) and FIG. 3(b) show an exemplary block diagram of a current sensor device according to a third embodiment of the present invention, in top view and in cross sectional view respectively.
Figure 3B:
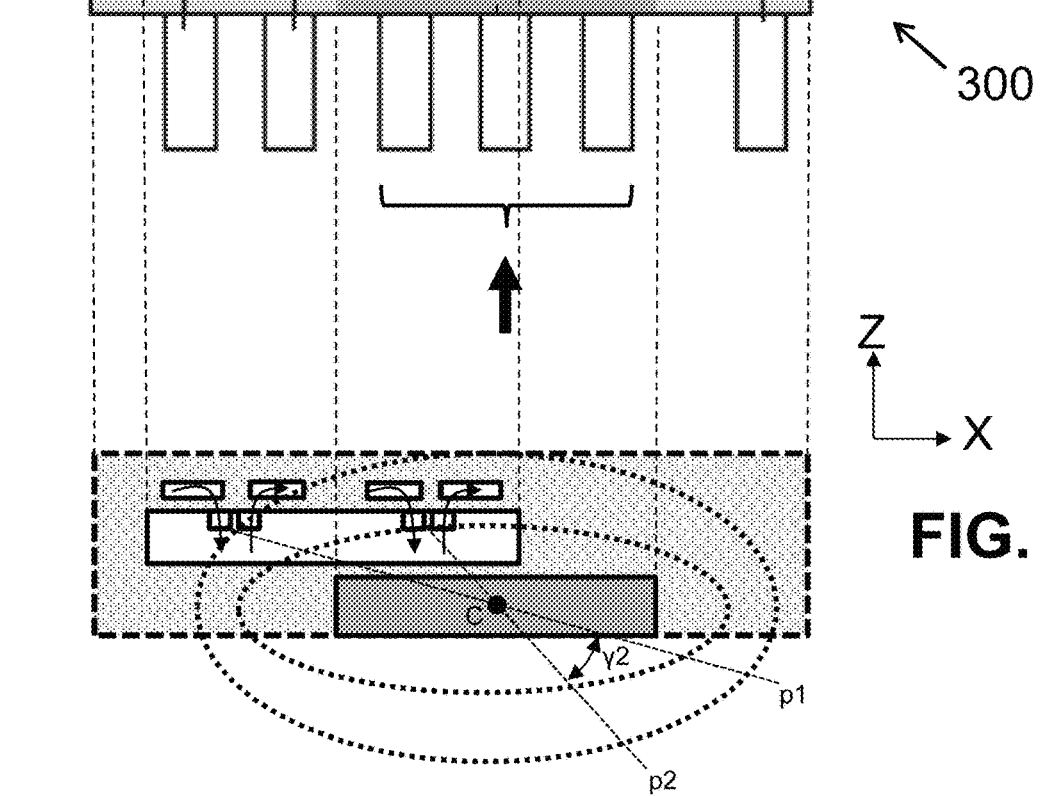

For example, in FIG. 3(a) and FIG. 3(b) the first and second magnetic sensor are also based on horizontal Hall elements with IMC, but the shape of the four magnetic concentrators 321, 322 is different from that of FIGS. 1(a) and 1(b). From these examples, it shall be clear that horizontal Hall elements with IMC having other shapes may also be used.

It is an advantage of using horizontal Hall elements with IMC because IMC provides passive signal amplification (typically by a factor of about 5 or 6). The IMC thickness is typically in the range from about 20 to 25 micron, e.g. equal to about 23 micron.

Figure 4A:
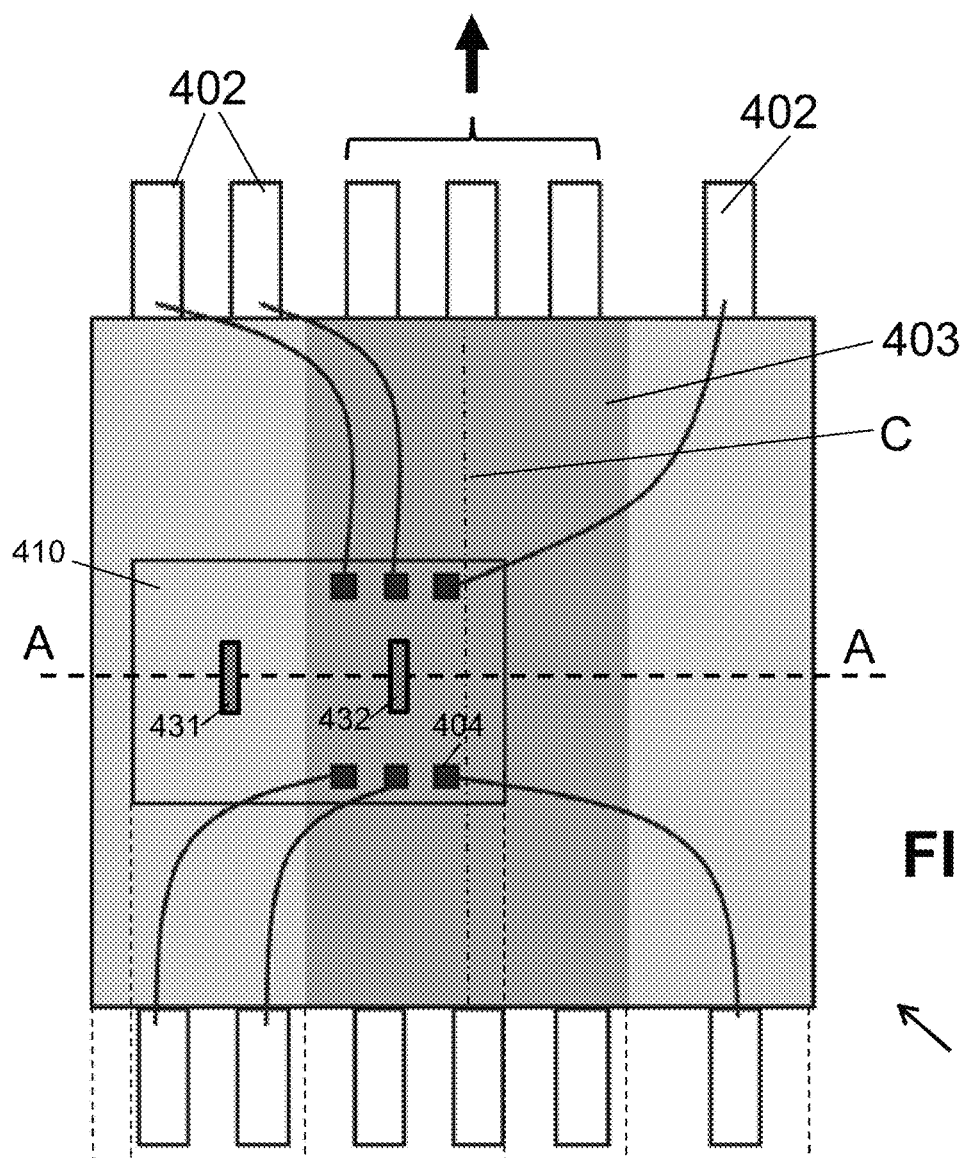
FIG. 4(a) and FIG. 4(b) show an exemplary block diagram of a current sensor device according to a fourth embodiment of the present invention, in top view and in cross sectional view respectively.
Figure 4B:
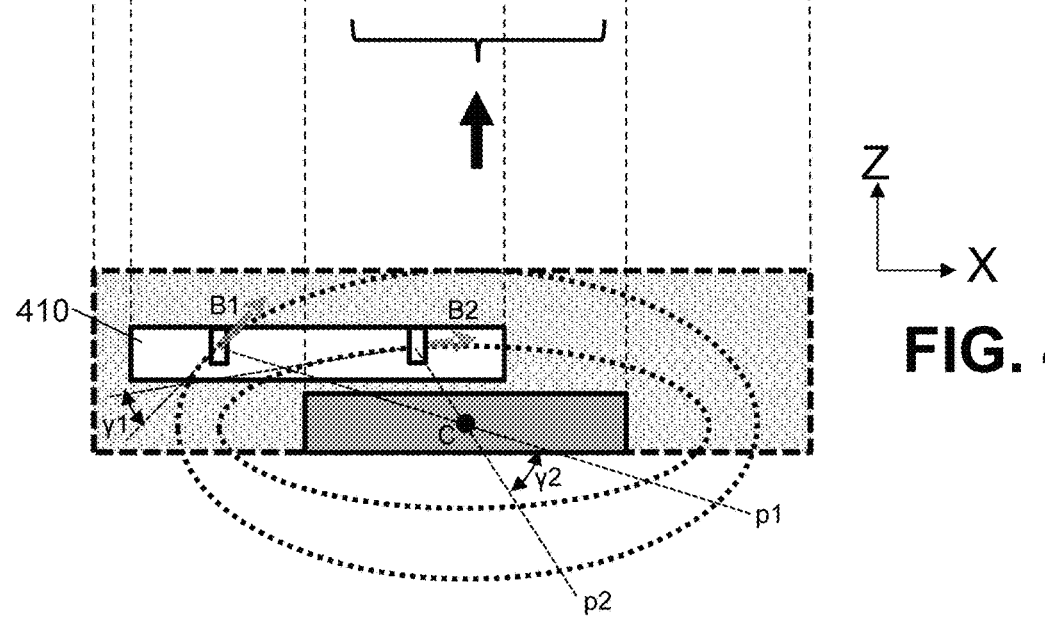

For example, in FIG. 4(a) and FIG. 4(b) the first magnetic sensor comprises a vertical Hall element 431, and the second magnetic sensor comprises a vertical Hall element 432.

While not explicitly shown, also other magnetic sensing elements may be used, such as for example magnetoresistive elements, e.g. GMR elements arranged in a wheatstone bridge. Other types of magnetoresistance sensors may also be used, for example comprising at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

While not explicitly shown, the sensors may further include suitable biasing or excitation circuitry and readout circuitry. For example, in the case of Hall elements, spinning current may be used to reduce offset errors. For example, in case of magnetoresistive elements, a closed loop circuit may be used to reduce non-linearities by generating a local magnetic field at the sensors location, etc. Magnetic sensors and suitable biasing or excitation circuits and suitable readout circuits are known in the art, and hence need not be explained in more detail here.

While not explicitly shown in FIGS. 1(a) and 1(b), the substrate may further comprise an electrical processing circuit. Examples of processing circuitry will be shown in FIG. 6 and FIG. 7, but the invention is not limited to these examples, and other processing circuits may also be used.

Referring back to FIGS. 1(a) to 1(c), the substrate 110 has a first surface, also referred to as the active surface containing the sensor elements and the processing circuit, and a second surface.

In the example of FIGS. 1(a) to 1(c) the substrate 110 is located above or on top of the electrical conductor, and the active surface of the substrate is facing away from the electrical conductor 103.

The substrate 110 may be placed directly on top of the electrical conductor without an additional insulating material in between.

In other embodiments, the substrate 110 may comprise an insulating layer, e.g. an oxide layer or a nitride layer at the second surface, which may contact the electrical conductor 103.

In yet other embodiments, an insulating layer, e.g. an insulating polymer or an insulating tape is applied between the substrate 110 and the electrical conductor 103.

In other embodiments (known as "flip chip" arrangement), the substrate 110 has a first surface containing the first and second sensor element, and the first surface is facing the electrical conductor. In this case, the substrate is spaced from the electrical conductor, and the chip preferably further comprises an electrical isolating material located between the first surface and the electrical conductor.

The distance between the first surface of the substrate and the electrical conductor may be a value in the range from 150 to 250 µm, or in the range from 170 to 210 µm, for example equal to about 190 micron. The electrical isolating material may be adapted to withstand a voltage of at least 1000 Volt.

In embodiments where the substrate is separated from the electrical conductor by means of an electrically insulating tape, the distance between the substrate and the electrical conductor may be a value in the range from about 10 to 100 or from about 30 to 100 or from 30 to 80 or from 30 to 50 for example equal to about 40 µm.

It is an advantage of this embodiment that the distance between the sensors and the electrical conductor 103 is relatively small, and that the signal measured by the sensors is relatively large (larger than in case the second surface was facing the electrical conductor). This improves the Signal-To-Noise ratio, and thus the accuracy of the measurement.

In this embodiment, the substrate is mechanically supported at a first region or first end by the electrical conductor and the isolation material.

The substrate may be mechanically supported at one end, and left floating on the other end, with a gap underneath, and with a gap between the substrate and the first leads, as shown for example in FIG. 1(a) to FIG. 4(b). The gap may be fully or partly filled by air, or by a mold compound, or by insulation tape or another electrically isolating material (e.g. a suitable polymer). The substrate 110 may be electrically connected with one or more second leads 102 by means of wire bonds 105 interconnecting bond pads 104 on the substrate 110 with second leads 102. The bond pads are located in a region of the substrate (right half of the substrate 110 shown in FIGS. 1(a) to 1(c)) that is mechanically supported by the electrical conductor 103 and/or supported by lead(s) of said leadframe. No bond wires are applied to the floating region (left half of the substrate shown in FIGS. 1(a) to 1(c)).

Alternatively, the substrate 110 may be supported at opposite ends, for example as illustrated in FIG. 5, where some of the second leads 502s are connected to or shaped so as to form a mechanical support. In the example of FIG. 5, two opposite leads 502s are interconnected to form a suspension upon which the substrate 510 can rest. In this case, bond pads 504 connected to second leads 502 via bond wires 505 may be provided anywhere on the substrate, not only in a "region resting upon the electrical conductor" (right part in FIG. 5), but also in a "region located outside of the electrical conductor" but e.g. supported by second leads 502s (left part in FIG. 5). In the example of FIG. 5 two opposite leads 502s are interconnected, but that is not absolutely required, and it may also be possible to provide two separate supports (e.g. a first support in the upper left corner of FIG. 5 connected to the (one or more) upper lead 502s, and a second support in the lower left corner of FIG. 5 connected to the (one or more) lower lead 502s).

In some embodiments, the substrate 110 is supported by a portion of the leadframe which is connected to ground, also referred to herein as a "ground plane".

The substrate 110 may also comprise a plurality of solder bumps (not shown), e.g. located on the second surface. The solder bumps may be electrically connected to elements or tracks or components on the first surface by means of "through vias". The solder bumps may rest upon and be connected to second leads 102, but the solder bumps are galvanically separated from the electrical conductor 103 and from the first leads 101a, 101b. The galvanic separation may be implemented by a gap filled with air, or a gap filled with mold compound or a gap filled with an isolating material, e.g. an insulating tape, or in any suitable manner.

FIG. 1(c) shows an enlarged view of FIG. 1(b).

In a first variant, the first magnetic sensor 111 comprises only a single horizontal Hall element 131a with two IMC 121a, 121b on top, and the second magnetic sensor 112 comprises a single horizontal Hall element 131c with two IMC 122a, 122b on top. Thus, in this embodiment, the horizontal Hall elements 131b and 131d are omitted. The elements 131a and 131c form an asymmetric sensor pair. The element 131a may measure v1~−Bx+Bz−K1·current, (where ~ means "proportional to"), and the element 131c may measure v2~−Bx+Bz−K2·current. The current I can then be calculated based on a difference of these signals, e.g. as v1−v2, or as a weighted difference of these signals, e.g. as A·v1−B·v2, where A and B are constants, which may be determined during calibration. At least one of these constants may be different from 1.00. This can be used to compensate for sensitivity mismatch.

Alternatively, only sensor elements 131b and 131d may be used, and 131a and 131c may be omitted.

In another variant, four horizontal Hall elements 131a to 131d are present, wherein the elements 131a and 131c form a first asymmetric pair, and the elements 131b and 131d form a second asymmetric pair. The element 131b may measure v1b~+Bx+Bz+K1·current, and the element 131d may measure v2b~+Bx+Bz+K2·current. In this embodiment a first value of the current (I1) can be calculated based on the values obtained from the first asymmetric pair 131a, 131c, and a second value of the current (I2) can be calculated based on the values obtained from the second asymmetric pair 131b, 131d. If the first current value (I1) and the second current value (I2) satisfy a predefined criterium, e.g. have a difference smaller than a predefined value, or have a ratio within a predefined range (e.g. from 95% to 105%), the circuit may provide a average of the two current values as "the" current value. If the value of the first current (I1) and the value of the second current (I2) are substantially different, e.g. have a difference larger than said predefined value, or have a ratio outside said predefined range, a warning or error signal may be provided. This embodiment offers redundancy which can be used for functional safety purposes.

FIG. 2(a) and FIG. 2(b) show an exemplary block diagram of a current sensor device 200, in top view and in cross sectional view respectively. The current sensor device 200 is a variant of the current sensor 100 of FIG. 1(a). The main differences between the current sensor 200 of FIG. 2(a) and the current sensor 100 of FIG. 1(a) is that the integrated magnetic concentrators (IMC) are different. More in particular, FIG. 2(a) shows a current sensor 200 having four horizontal Hall elements and three IMC elements, namely two trapezoidal outer IMC 221, 222 and one stretched octagonal intermediate IMC which is common for both sensors. Everything else described above for the current sensor 100 of FIG. 1(a) and variations thereof is also applicable here, for example, as mentioned above, only two of the horizontal hall elements are needed, the other two can be used for redundancy or for improved accuracy or increased sensitivity or both.

FIG. 3(a) and FIG. 3(b) show an exemplary block diagram of a current sensor device 300, in top view and in cross sectional view respectively. The current sensor device 300 is a variant of the current sensor device 100 of FIG. 1(a). The main differences between the current sensor device 300 of FIG. 3(a) and the current sensor device 100 of FIG. 1(a) is that the integrated magnetic concentrators (IMC) are different. More in particular, FIG. 3(a) shows a current sensor having four horizontal Hall elements and four trapezoidal IMC components, namely two IMC components 321 for the first magnetic sensor 311, and two IMC components 322 for the second magnetic sensor 312. Everything else described above for the current sensor device 100 of FIG. 1(a) and variations thereof is also applicable here.

FIG. 4(a) and FIG. 4(b) show an exemplary block diagram of a current sensor device 400, in top view and in cross sectional view respectively. The current sensor device 400 is a variant of the current sensor device 100 of FIG. 1(a). The main differences between the current sensor device 400 of FIG. 4(a) and the current sensor device 100 of FIG. 1(a) is that the first magnetic sensor comprises a first vertical Hall element 431 and the second magnetic sensor comprises a second vertical Hall element 432, both configured for measuring a magnetic field component Bx oriented in a direction parallel to the plane XY defined by the length and the width of the current conductor 403, in the transverse direction X. No IMC is present. The vertical Hall elements have an axis of maximum sensitivity in the X-direction, or in other words, the first magnetic sensor is adapted for measuring a first magnetic field component B1x, and the second magnetic sensor is adapted for measuring a second magnetic field component B2x.

Everything else described above for the current sensor device 100 of FIG. 1(a) and variations thereof is also applicable here. In particular, the first sensor is preferably located relatively far away from the electrical conductor 403, such that Bx1 is relatively small, while the second sensor is preferably located relatively close to the middle of the electrical conductor, such that Bx2 is relatively large.

The two vertical Hall elements 431, 432 shown in FIG. 4(a) form a first asymmetric pair. It is possible to add two more vertical Hall elements for redundancy or functional safety purposes, in a manner similar as described in FIG. 1(c), but without IMC. More in particular, a third vertical Hall element may be located near, e.g. adjacent the first Hall element 431, and a fourth vertical Hall element may be located near, e.g. adjacent the second Hall element 432. The third and fourth vertical Hall element would form a second asymmetric pair. A first value (I1) of the current to be measured can be calculated based on the signals from the first asymmetric pair, and a second value (I2) of the current to be measured can be calculated based on the signals from the second asymmetric pair. The first current (I1) may be calculated based on a difference of the first and second signal, for example according to the formula: $K*(v1-v2)$, where K is a predefined constant, and v1, v2 are the signals provided by the first and second sensor respectively, or based on a weighted average of these signals, for example according to the formula: $K*(A \cdot v1-B \cdot v2)$, where A and B are predefined constants, which may be determined during a calibration test. Likewise, a second value (I2) for the current to be measured can be calculated. If the first current value (I1) and the second current value (I2) are more or less the same, according to a predefined criterion, an average of the first current value and the second current value may be provided as "the" current value, otherwise, an error signal may be provided. Due to the subtraction, the influence of an external disturbance field (if present) is reduced or eliminated.

In another variant (not shown), three vertical Hall elements are provided on the substrate, (for example a third vertical Hall element is added which is substantially located halfway the Hall elements shown in FIGS. 4(a) and 4(b), which would provide a third signal v3. It is then possible to calculate a first current value (I1) using the left and middle Hall element, for example using the formula $I1=K1 \cdot (v1-v3)$ or using the formula $I1=K1 \cdot (A \cdot v1-B \cdot v3)$; and to calculate a second current value (I2) using the right and middle Hall element, for example using the formula $I2=K2 \cdot (v2-v3)$ or using the formula $I2=K2 \cdot (C \cdot v2-B \cdot v3)$, where A, B and C are constants which may be used to correct sensitivity-mismatch of the different sensor elements. Like above, each of the first and second current value are substantially insensitive to an external disturbance field. It is an advantage of this embodiment that it requires only three vertical Hall elements instead of four.

In another variant of FIGS. 4(a) and 4(b) (not shown), the vertical Hall elements 431, 432 are replaced by horizontal Hall elements, but no IMC is present. The horizontal Hall elements have an axis of maximum sensitivity in the Z-direction, or in other words, the first magnetic sensor is adapted for measuring a first magnetic field component B1z, and the second magnetic sensor is adapted for measuring a second magnetic field component B2z. Everything else described above for the current sensor device 100 of FIG. 1(a) and variations thereof is also applicable here.

In a particular example, the first magnetic sensor 431 is preferably located at a distance smaller than 30% of the conductor width Wc from the edge of the electrical conductor 403, such that Bx1 is relatively large, while the second sensor 432 is preferably located relatively close to the middle of the electrical conductor, for example at a distance smaller than 10% of the width Wc of the conductor 403, such that Bx2 is relatively small.

In a particular example, a projection of the second sensor 432 is situated substantially in the middle of the electrical conductor, substantially above or below the centerline C. In this embodiment the value of B2z induced by the current is substantially equal to zero, hence, the second sensor 432 would only measure a strayfield component. This embodiment allows to directly measure the strayfield component without solving a set of equations. The value of the strayfield may be amplified and output as an analog signal, and/or may be digitized and provided as a digital output value. As far as is known to the inventors, there are no current sensors which deliberately position one of the sensor elements at this location where no signal from the current conductor 403 can be measured. Yet, by doing so, the dimensions of the substrate can be reduced by a factor of about two, while at the same time the influence from an external disturbance field can be reduced. This insight is not known in the prior art. Instead, in prior art current sensors, the sensor elements are typically located at an equal distance from the centerline, maybe because it is falsely believed that the sensor elements must not be located above or below the electrical conductor in order to measure the disturbance field.

FIG. 5(a) and FIG. 5(b) show an exemplary block diagram of a current sensor device 500, in top view and in cross sectional view respectively. The current sensor device 500 is a variant of the current sensor device 100 of FIG. 1(a). The main differences between the current sensor device 500 of FIG. 5(a) and the current sensor device 100 of FIG. 1(a) is that the substrate 510 is not only supported at one end (right side of FIG. 5) e.g. by an electrical conductor 503 (directly, or indirectly via an insulating material), but is also supported at an opposite side or edge of the substrate (left side of FIG. 5(a)) by one or more second leads 502s and/or an extension thereof and/or an interconnection thereof. The substrate 510 may comprise bond pads 504 which are located anywhere on the substrate 510, not only on the substrate portion which is supported by the electrical conductor 503. These bond pads 504 can be connected to second leads 502 via bond wires 505. This allows for a more efficient use of the substrate area. Everything else described above for the current sensor device 100 of FIG. 1(a) and variations thereof is also applicable here, mutatis mutandis.

It shall be clear that the feature of "supporting the substrate at two ends thereof" also works for other magnetic sensors, or in other words, this feature can also be added to the current sensors of FIG. 2(a) to FIG. 4(b). The skilled person can find or design a new package with a sufficient number of pins.

Figure 6:
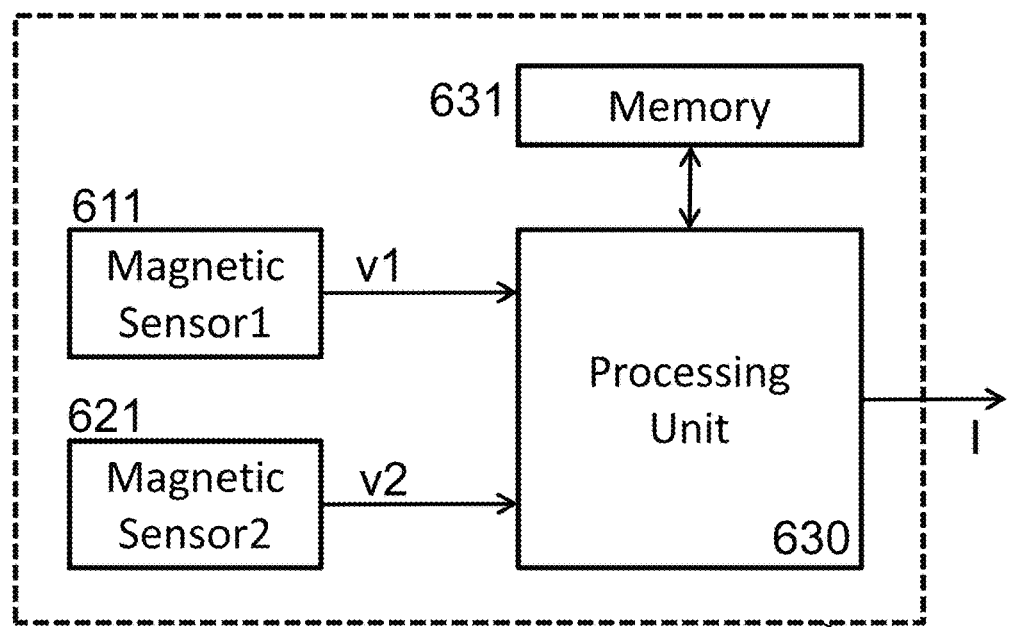
FIG. 6 shows an electrical block-diagram of an electrical circuit which can be used in embodiments of the present invention.

FIG. 6 shows an electrical block-diagram of a circuit 610 that can be used in a current sensor device, e.g. as shown in FIG. 1(a) to FIG. 5(b), in the absence of one or more temperature sensor(s) and one or more stress sensor(s), or at least not taking the values provided by them into account. It is noted that the current conductor is omitted from this drawing, because it is galvanically separated from this circuit, even though the electrical conductor is physically located in the vicinity of the first and second magnetic sensor 611, 621.

The processing unit 630 is adapted for determining the current to be measured in any known manner, for example by calculating the current according to the formula: $I=K \cdot (v1-v2)$, where K is a predefined constant (e.g. determined during design or during an evaluation phase), v1 is the value provided by the first magnetic sensor 611, and v2 is the value provided by the second magnetic sensor 621. The processing unit 630 may comprise a digital processor comprising or connected to a non-volatile memory 631 storing at least one constant value K.

While not explicitly shown, the processing circuit 610 may comprise a differential amplifier configured for determining and amplifying a difference between the first value v1 and the second value v2, and for amplifying this difference. Alternatively, the processing circuit 610 may comprise an amplifier configured for selectively amplifying the first value v1 and the second value v2. The sensor device may further comprise an analog-to-digital convertor ADC configured for digitizing this amplified difference signal. The ADC may be part of a digital processor circuit. The current to be measured may be provided as an analog output signal proportional to the current or may be provided as a digital signal indicative of the current to be measured. The second leads (shown in FIG. 1(a) to FIG. 5(b) and FIGS. 8(a) and 8(b)) may be used to provide a supply voltage and a ground signal to the processing circuit 610, and/or to provide a data interface, for example a serial data bus (e.g. using the I2C protocol, or using RS232 protocol, or any other suitable protocol), and/or other input signals or output signals, as desired.

Figure 7:
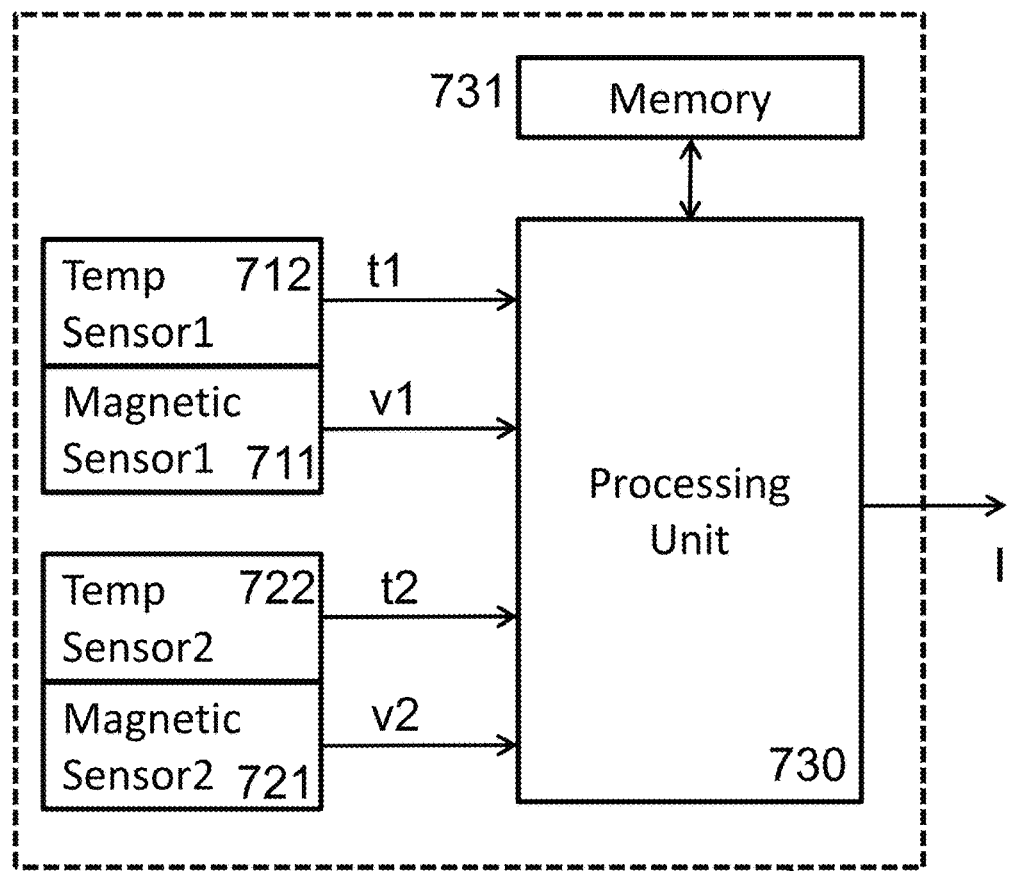
FIG. 7 shows an electrical block-diagram of an electrical circuit which can be used in embodiments of the present invention.

FIG. 7 shows an electrical block-diagram of a processing circuit 710 which can be seen as a variant of the processing circuit 610 of FIG. 6, further comprising a first and a second temperature sensor 712, 722, communicatively connected to the processing unit 730. The processing unit 730 is adapted for determining the current to be measured based on the values v1 and v2 but taking into account one or both of the temperature signals t1, t2. The measured temperature(s) can be taken into account for compensating the measurement values v1, v2 for temperature variations, e.g. to compensate for sensitivity variations of the sensor elements. Such compensation techniques are known per se in the art, and hence need not be explained in more detail here. In a particular embodiment, a temperature compensation is performed in a manner similar as described in EP3109658A1, which is incorporated herein by reference in its entirety.

It is an advantage of this current sensor that it includes a temperature compensation mechanism. In this way, the accuracy of the current measurement can be further improved.

The processing unit 630 of FIGS. 6 and 730 and FIG. 7 may contain a digital processor, for example a programmable microcontroller. Although not explicitly shown, the circuit 610 and 710 may also contain at least one analog-to-digital convertor, which may be part of the magnetic sensors, or may be part of the processing unit, or may be implemented as a separate circuit (e.g. between an output of the sensor circuit and an input of the processing unit). The block diagram of FIG. 6 and FIG. 7 does not show this level of detail, for the same reasons as it does not show a biasing circuit, a readout circuit, an optional amplifier, a power supply, etc., which are all well known in the art, and hence need not be described in detail here.

It is noted in this respect that if the signals v1, v2, t1 and t2 are analog signals, the processing unit 730 may contain at least one ADC to convert these analog signals into digital signals, whereas in case the signals v1, v2, t1 and t2 are digital signals, the processing unit 730 need not have an ADC.

It is an advantage of embodiments with two temperature sensors, one for each magnetic sensor, because the temperature of the first and second magnetic sensor may be substantially different, especially if a relatively high current (e.g. larger than 30 Amps) is being measured, because such a high current typically causes the electrical conductor to warm up significantly, causing a relatively large temperature gradient over the substrate. In this way the accuracy of the current measurement can be further improved.

In a variant (not shown) of FIG. 7, the circuit comprises only one temperature sensor, which may be arranged for measuring the temperature of the first magnetic sensor, or for measuring the temperature of the other magnetic sensor. The temperature of the other magnetic sensor may then be estimated based on the estimated power dissipation (in turn based on v1 and v2) and based on an predefined assumption of the ambient temperature, instead of actually measuring the other temperature. Of course, an embodiment with two temperature sensors is more accurate.

In a variant (not shown) of FIG. 7, the circuit comprises one or two stress sensors instead of one or two temperature sensors, and the processing unit 730 is adapted for determining the current based on the values obtained from the magnetic sensors, taking into account the stress value(s) obtained from one or both stress sensors.

In another variant (not shown) of FIG. 7, the circuit additionally comprises one or two stress sensors in addition to one or two temperature sensors, and the processing unit 730 is adapted for determining the current based on the values obtained from the magnetic sensors and the one or more temperature sensors and the one or more stress sensors.

The processor may be further adapted for calculating a first current and a second current, as described above, for example in relation with FIG. 1(c), where the third magnetic element 131c may be arranged as a backup for the first magnetic element 131a, and the fourth magnetic element 131d may be arranged as a backup for the second magnetic element 131b. The third and fourth element 131c and 131d may be arranged at a similar distance as the first and second element 131a, 131b respectively, but that is not absolutely required. In fact, it may even be desirable to use other differences such as distances or sensor type, in order to provide what is called "non-heterogeneous redundancy". The processing circuit may be adapted to calculate a first current value I1 based on the first and second value v1, v2, and may be further adapted to calculate a second current value I2 based on the third and fourth value v3, v4. Both measurements are stray-field immune. The first current I1 and the second current I2 should ideally be the same, unless the current sensor is malfunctioning.

During use, the circuit can calculate the first and second current, and calculate a difference I1-I2 or a ratio I1/I2, and if the difference is smaller than a predefined threshold, or if the ratio lies within predefined boundaries, the circuit can conclude that the measurements are correct, and if the calculated difference or ratio lies outside said boundaries, the circuit can conclude that the measurements are incorrect. If the circuit is designed such that the predefined value of R is about equal to 1, then the circuit may provide the average of I1 and I2 in case the measurement is correct. In this way, the SNR can be further improved. Embodiments with three or four magnetic sensors can be used for redundancy and/or functional safety purposes.

Figure 8A:
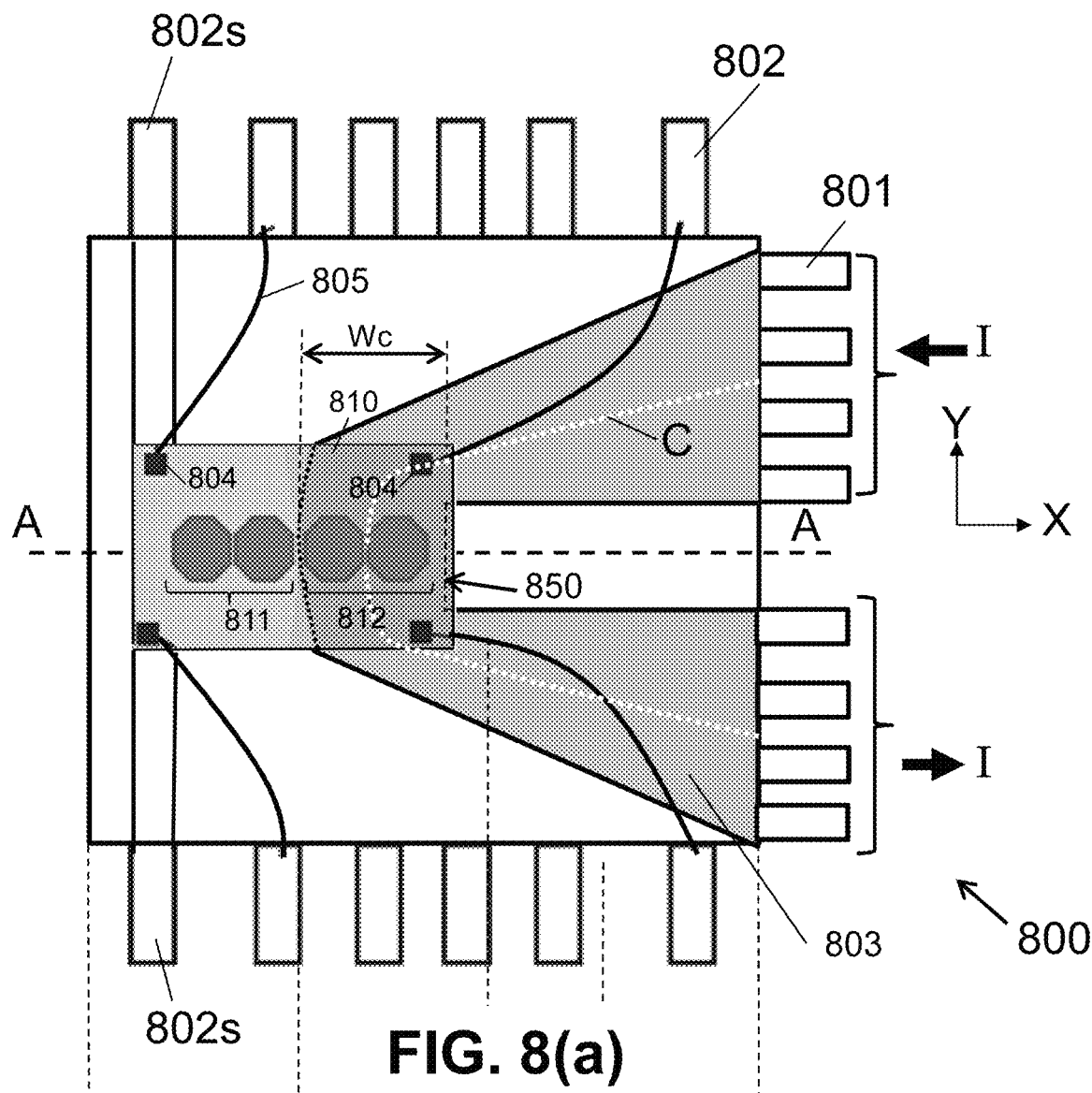
FIG. 8(a) and FIG. 8(b) show an exemplary block diagram of a current sensor device according to another embodiment of the present invention, in top view and in cross sectional view respectively.
Figure 8B:
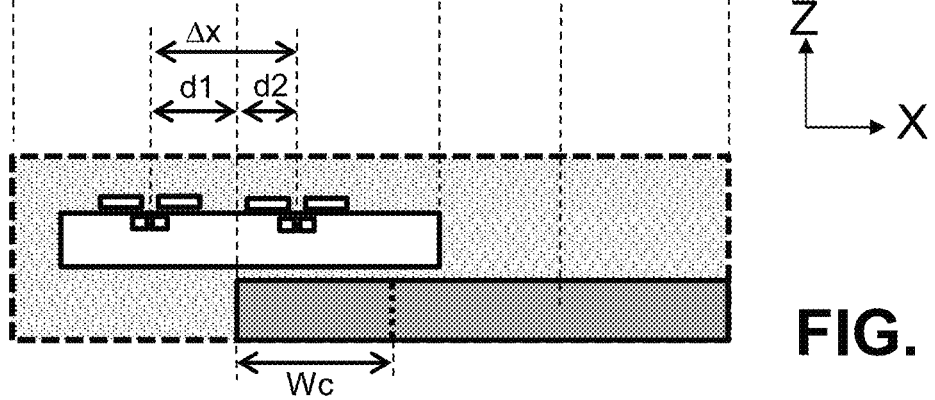

FIG. 8(a) and FIG. 8(b) show an exemplary block diagram of a current sensor device 800, in top view and in cross sectional view respectively. The current sensor device 800 is a variant of the current sensor device 100 of FIG. 1(a). The main differences between the current sensor device 800 of FIG. 8(a) and the current sensor device 100 of FIG. 1(a) is that the electrical conductor 803 is not straight but is U-shaped. In the vicinity of the first and second magnetic sensor 811, 812, the electrical conductor 803 has an infinitesimal small beam-shaped conductor portion or a beam shaped conductor portion with an infinitesimally small length. The centerline or heartline C is shown in dotted line, and also has a curved shape, e.g. a U-shape or V-shape or C-shape. In this embodiment, the current to be measured (locally) flows in a direction substantially parallel to said centerline C and significantly perpendicular to a transversal cut of said leadframe, or otherwise stated, parallel to a plane containing the electrical conductor 803. Everything else described above for the current sensor device 100 of FIG. 1(a) and variations thereof is also applicable here, mutatis mutandis.

Figure 9:
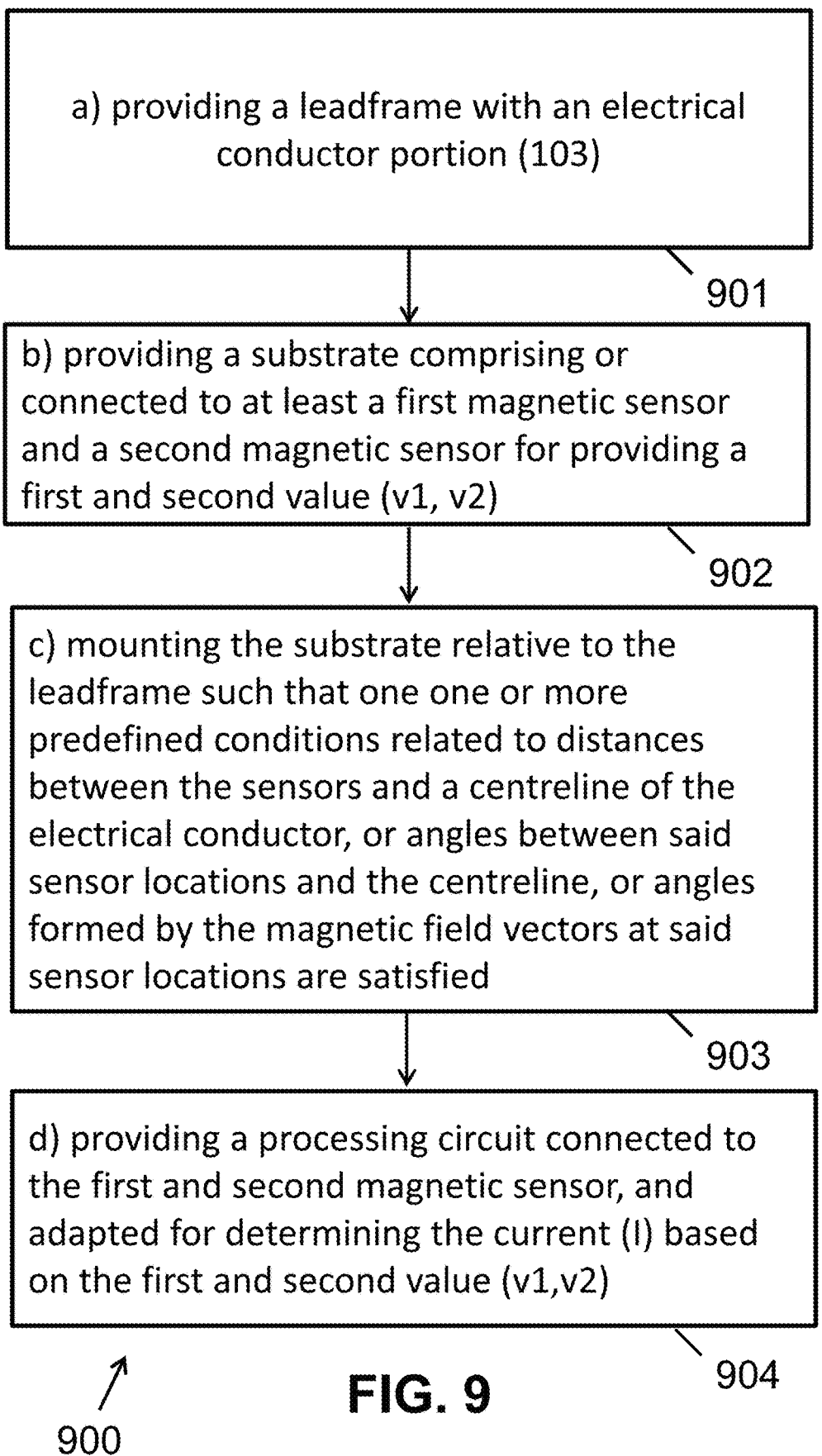
FIG. 9 shows a flow chart of an exemplary method of producing a current sensor according to embodiments of the present invention.

FIG. 9 shows a flow chart of an exemplary method 900 of producing a current sensor as described above. The method comprises the following steps:
a) providing 901 a leadframe comprising an electrical conductor 103;
b) providing 902 a substrate comprising or connected to at least a first magnetic sensor and comprising or connected to a second magnetic sensor, wherein the first magnetic sensor has a first axis of maximum sensitivity and is configured for providing a first value v1, and wherein the second magnetic sensor has a second axis of maximum sensitivity substantially parallel, e.g. parallel to the first axis of maximum sensitivity, and is configured for providing a second value v2;
c) mounting 903 the substrate relative to the leadframe such that that one one or more predefined conditions related to distances between the sensors and a centreline of the electrical conductor, or angles between said sensor locations and the centreline, or angles formed by the magnetic field vectors at said sensor locations are satisfied;
d) providing 904 a processing circuit connected to the first and second magnetic sensor and adapted for determining the current I to be measured at least based on the first value v1 and the second value v2.

In an embodiment, the substrate comprises the first magnetic sensor and the second magnetic sensor and the processing circuit, and step d) is comprised in step b).

In an embodiment, step b) comprises providing a substrate further comprising an isolation layer (e.g. an oxide layer or nitride layer); and step c) comprises mounting the substrate directly on top of the electrical conductor.

In an embodiment, step c) comprises providing an insulating tape on top of the electrical conductor and mounting the substrate on top of the insulating tape.

While individual features are explained in different drawings and different embodiments of the present invention, it is contemplated that features of different embodiments can be combined, as would be obvious to the skilled person, when reading this document.

The invention claimed is:

1. A current sensor device for measuring a current, comprising:
    a leadframe comprising a first portion comprising first leads connected or shaped so as to form an electrical conductor adapted to carry the current to be measured, and a second portion comprising a plurality of second leads;
    a substrate comprising or connected to at least a first magnetic sensor and comprising or connected to a second magnetic sensor the first and second magnetic sensor forming a first magnetic sensor pair;
    wherein the first magnetic sensor has a first axis of maximum sensitivity, and the second magnetic sensor has a second axis of maximum sensitivity parallel to the first axis;
    wherein the first magnetic sensor is located at a first location and is configured for providing a first value indicative of a first magnetic field component at said first location;
    wherein the second magnetic sensor is located at a second location and is configured for providing a second value indicative of a second magnetic field component at said second location;
    wherein a magnetic field induced by the current to be measured, when flowing through the electrical conductor, defines a first magnetic field vector at the first sensor location, and defines a second magnetic field vector at the second sensor location, the first magnetic field vector and the second magnetic field vector defining crossing or intersecting lines;

a processing circuit connected to the first and second magnetic sensor, and adapted for determining the current to be measured at least based on a difference or weighted difference between the first value and the second value obtained from the first sensor pair; and wherein the electrical conductor has a centerline, and a first distance between the centerline and the first sensor location is different from a second distance between the centerline and the second sensor location; and wherein the first and second sensor location are situated such that one or more of the following conditions is satisfied:

i) a projection of the first sensor location perpendicular to a plane parallel to the electrical conductor is located outside of the electrical conductor, and a projection of the second sensor location perpendicular to said plane is located inside the electrical conductor;

ii) an angle γ1 defined by the first magnetic field vector at the first sensor location and the second magnetic field vector at the second sensor location is an angle in the range from 70° to 110°;

iii) an angle γ2 between a first virtual plane containing the centerline and the first sensor location, and a second virtual plane containing the centerline and the second sensor location is an angle in the range from 30° to 110°.

2. The current sensor device according to claim 1, wherein each of the first and second magnetic sensor comprises at most one or at least one or at least two Horizontal Hall element and at least one or two integrated magnetic concentrators.

3. The current sensor device according to claim 1, wherein the leadframe is a copper leadframe having a thickness in the range from 100 to 600 micron.

4. The current sensor device according to claim 1, wherein a first distance d1 between an edge of the electrical conductor and the projection of the first sensor location is larger than 10% of a width Wc of the electrical conductor; and/or wherein a second distance d2 between the centerline of the electrical conductor and the projection of the second sensor location is smaller than 10% of a width Wc of the electrical conductor.

5. The current sensor device according to claim 1, wherein a distance between the first sensor location and the second sensor location is smaller than a width Wc of the electrical conductor; or wherein a width Ws of the substrate is smaller than 90% or smaller than 80% or smaller than 70% or smaller than 60% or smaller than 50% or smaller than 40% of a width Wc of the electrical conductor.

6. The current sensor device according to claim 1, wherein the electrical conductor has a width Wc in the range from 1.0 mm to 7.0 mm; and/or wherein the substrate has an area in the range from 1 to 5 mm².

7. The current sensor device according to claim 1, wherein the substrate has a first surface containing the first and second magnetic sensor, and wherein the first surface is facing the electrical conductor; and wherein the current sensor device further comprises an electrical isolating material located between the first surface of the substrate and the electrical conductor.

8. The current sensor device according to claim 1, wherein the substrate has a first surface containing the first and second magnetic sensor, and wherein the first surface is facing away from the electrical conductor.

9. The current sensor device according to claim 1, wherein the substrate further comprises a plurality of bond pads located on a portion of the substrate overlapping the electrical conductor; and wherein the current sensor device further comprises a plurality of bond wires interconnecting one or more of the plurality of second leads and one or more of the plurality of bond pads.

10. The current sensor device according to claim 1, wherein the substrate further comprises a plurality of solder bumps connected to at least some of the second leads, but galvanically separated from the electrical conductor and from the first leads.

11. The current sensor device according to claim 1, wherein the electrical circuit comprises a differential amplifier configured for determining and amplifying said difference between the first value and the second value; or wherein the electrical circuit comprises an amplifier configured for selectively amplifying the first value and the second value.

12. The current sensor device according to claim 1, further comprising a digital processor comprising or connected to a non-volatile memory storing at least one constant value, and wherein the digital processor is adapted for determining the current to be measured based on a difference between the first value and the second value and based on said constant value.

13. The current sensor device according to claim 12, wherein the substrate further comprises at least one temperature sensor configured for measuring at least one temperature related to a temperature of the first magnetic sensor and/or the second magnetic sensor, the at least one temperature sensor being connected to the digital processor; and wherein the digital processor is adapted for calculating the current to be measured based on a difference or weighted difference between the first value and the second value, and taking into account the at least one measured temperature.

14. The current sensor device according to claim 12, wherein the substrate further comprises at least one stress sensor configured for measuring at least one stress value related to mechanical stress experienced by the first magnetic sensor, the at least one stress sensor being connected to the digital processor; and wherein the digital processor is adapted for calculating the current to be measured based on a difference or weighted difference between the first magnetic value and the second magnetic value, and taking into account the at least one measured stress value.

15. The current sensor device according to claim 1, wherein the current value determined by the processing circuit based on the first and second magnetic sensor is considered as a first current value; and wherein the substrate further comprises a third magnetic sensor arranged in a similar manner as the first magnetic sensor and configured for measuring a third value, and further comprises a fourth magnetic sensor arranged in a similar manner as the second magnetic sensor and configured for measuring a fourth value; and wherein the processing circuit is further connected to the third magnetic sensor for obtaining the third value, and to the fourth magnetic sensor for obtaining the fourth value, and is further adapted for determining a second current value based on a difference between the third value and the fourth value; and is further adapted for comparing the second current value and the first current value, and if a difference or a ratio between the first and second current value satisfies a predetermined condition, to provide an average of the first current value and the second current value as the current value.

16. The current sensor device according to claim 1, wherein the leadframe is a copper leadframe having a thickness in the range from 100 to 600 micron; and wherein the first leads comprise first input leads located on one side of the device, and first output leads located on another side of the device, opposite the first side; and wherein the electrical conductor comprises a substantially planar and substantially beam shaped interconnection portion having a length spanning substantially the entire distance between the first input leads and the first output leads; and wherein the electrical conductor has an electrical resistance smaller than 0.80 mOhm; and wherein the beam shaped interconnection portion has a width in the range from 1.0 mm to 7.0 mm; and wherein the semiconductor substrate comprises said first magnetic sensor and said second magnetic sensor and said processing circuit integrated or embedded in said substrate; and wherein the width Ws of the substrate is smaller than the width We of the beam shaped interconnection portion; and wherein the projection of the first sensor location perpendicular to the plane defined by the length and the width direction of the beam shaped interconnection portion is located outside of the beam shaped interconnection portion, and wherein the projection of the second sensor location perpendicular to said plane is located on the beam shaped interconnection portion; and wherein the current sensor device is overmoulded so as to form a packaged current sensor device.

17. A method of producing a current sensor, comprising the steps:

a) providing a leadframe comprising an electrical conductor;

b) providing a substrate comprising or connected to at least a first magnetic sensor and comprising or connected to a second magnetic sensor, wherein the first magnetic sensor has a first axis of maximum sensitivity and is configured for providing a first value, and wherein the second magnetic sensor has a second axis of maximum sensitivity parallel to the first axis of maximum sensitivity, and is configured for providing a second value;

c) mounting the substrate relative to the leadframe such that one or more predefined conditions related to distances between the sensors and a centerline of the electrical conductor, or angles between said sensor locations and the centerline, or angles formed by etmagnetic field vectors at said sensor locations are satisfied;

d) providing a processing circuit connected to the first and second magnetic sensor and adapted for determining the current to be measured at least based on the first value and the second value.

18. The method of claim 17, further comprising step e) of: at least partially overmoulding the leadframe and the substrate so as to form a packaged current sensor device.

19. The method of claim 17, wherein step a) comprises:

providing said leadframe as a copper leadframe having a thickness in the range from 100 to 600 micron; the leadframe having first input leads located on one side of the leadframe and first output leads located on another side of the leadframe, opposite the first side;

the electrical conductor comprising a substantially planar and substantially beam shaped interconnection portion having a length spanning substantially the entire distance between the first input leads and the first output leads; the electrical conductor having an electrical resistance smaller than 0.80 mOhm;

the beam shaped interconnection portion having a width in the range from 1.0 mm to 7.0 mm; and/or wherein step b) and step d) comprise:

providing said semiconductor substrate with said first magnetic sensor and said second magnetic sensor and said processing circuit integrated or embedded in said substrate; and/or wherein the width Ws of the substrate is smaller than 90% or smaller than 80% or smaller than 70% or smaller than 60% or smaller than 50% or smaller than 40% of the width We of the beam shaped interconnection portion; and/or wherein step c) comprises mounting the substrate relative to the leadframe such that one end of the substrate is supported by the electrical conductor, and an opposite end of the substrate is supported by a mechanical support formed by an interconnection of second leads electrically insulated from the electrical conductor.

20. The method of claim 19, wherein the projection of the first sensor location perpendicular to the plane defined by the length and the width direction of the beam shaped interconnection portion is located outside of the beam shaped interconnection portion, and wherein the projection of the second sensor location perpendicular to said plane is located on the beam shaped interconnection portion.

21. The method of claim 17, wherein step c) further comprises:

providing an insulating tape on top of the electrical conductor and mounting the substrate on top of the insulating tape.

* * * * *